United States Patent
Lee et al.

(10) Patent No.: US 6,902,998 B2
(45) Date of Patent: Jun. 7, 2005

(54) METHODS OF MANUFACTURING SEMICONDUCTOR DEVICES HAVING STORAGE NODES

(75) Inventors: Sang-hyeon Lee, Kyungki-do (KR); Chang-hyun Cho, Kyungki-do (KR); Yang-keun Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/404,401

(22) Filed: Apr. 1, 2003

(65) Prior Publication Data

US 2004/0075156 A1 Apr. 22, 2004

(30) Foreign Application Priority Data

Oct. 16, 2002 (KR) .............................. 10-2002-0063025

(51) Int. Cl.[7] .............................................. H01L 29/02
(52) U.S. Cl. .................. 438/616; 438/618; 438/621; 438/6; 438/201; 438/629; 438/637; 257/503
(58) Field of Search ................................ 438/616, 618, 438/6, 621, 201, 629, 637; 257/503

(56) References Cited

U.S. PATENT DOCUMENTS 6,649,508 B1 * 11/2003 Park et al. .................. 438/618

FOREIGN PATENT DOCUMENTS

| KR | 2001-57666 A | 7/2001 |
|---|---|---|
| KR | 2002-34468 A | 5/2002 |

OTHER PUBLICATIONS

Notice to Submit a Response, Korean Application No. 10–2002–0063025, Sep. 23, 2004.

* cited by examiner

*Primary Examiner*—Edward Wojciechowicz
(74) *Attorney, Agent, or Firm*—Myers Bigel Sibley & Sajovec

(57) ABSTRACT

A semiconductor device is manufactured by forming a first insulating layer on a semiconductor substrate. First contact pads and second contact pads are formed that penetrate through the first insulating layer and are electrically connected to the semiconductor substrate. A second insulating layer is formed that has guide contact holes that expose upper surfaces of the first contact pads. An etch stopper is formed on bottoms and sidewalls of the guide contact holes of the second insulating layer. Bit lines are formed that are electrically connected to the semiconductor substrate by the second contact pads. The bit lines are electrically isolated from the first contact pads.

27 Claims, 22 Drawing Sheets

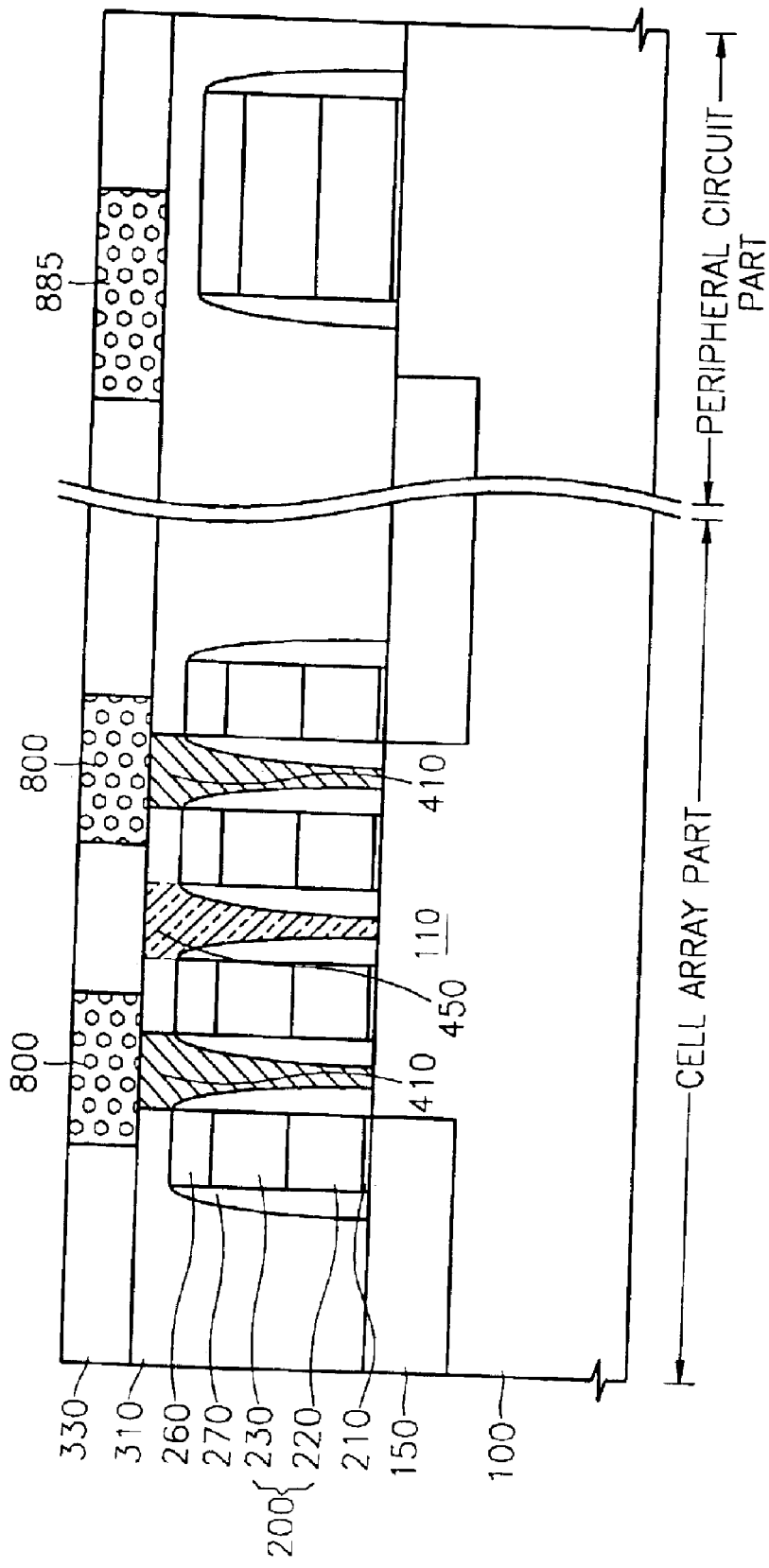

METHODS OF MANUFACTURING
SEMICONDUCTOR DEVICES HAVING
STORAGE NODES

RELATED APPLICATION

This application claims the priority of Korean Patent Application No. 2002-63025 filed on Oct. 16, 2002 in the Korean Intellectual Property Office, the disclosure of which is incorporated herein in its entirety by reference.

FIELD OF THE INVENTION

The present invention relates to semiconductor devices, and more particularly, to semiconductor devices having storage nodes

BACKGROUND OF THE INVENTION

Increased integration of semiconductor memory devices may be obtained by decreasing the minimum critical dimensions of the device features. However, the extent to which feature dimensions can be reduced can be limited by process overlay margins, which are related to the need to prevent the creation of a pattern bridge (i.e., electrical connections) between layers. For example, in a 90-nanometer dynamic random access memory (DRAM), at least 30-nanometer misalignment margins are sometimes required on a critical layer. Accordingly, improvement in process margins may allow increased integration of memory devices.

With a sharp decrease in the minimum critical dimension of semiconductor capacitor devices that have storage nodes stacked over bit lines, the need for improvement in their process margins may be particularly important. When storage nodes are formed over bit lines, the storage nodes should be electrically connected to a semiconductor substrate thereunder to operate a capacitor. For example, an interconnection structure may connect the storage nodes to the semiconductor substrate. The interconnection structure may use buried contacts (BC), and BC pads under the BC to connect the storage nodes to the semiconductor substrate.

However, as the minimum critical dimension of the semiconductor memory device decreases, it may become difficult to reliably obtain a process margin for forming the interconnection structure. As a result, the interconnection structure may not be completely insulated from a bit line interconnection structure, which connects bit lines to the semiconductor substrate. The bit lines have a structure in which a contact for the connection to the bit lines, e.g., a direct contact, is connected to a direct contact pad thereunder. However, a sharp decrease in the minimum critical dimension may cause the BC to not be completely insulated from the direct contact pad, which may render the storage node inoperable.

FIG. 1 is a cross-sectional view of a semiconductor device having conventional storage nodes. Referring to FIG. 1, capacitor storage nodes 60 are formed over a semiconductor substrate 10 so as to be electrically connected to the semiconductor substrate 10. The storage nodes 60 are positioned over bit lines 51 and 52 and are cylindrical so as to secure a wider effective area of a capacitor.

The storage nodes 60 are electrically connected to an active region 11 of the semiconductor substrate 10 via buried contact pads 41 penetrating through first dielectric layers 31 and buried contacts 61 penetrating through second dielectric layers 35. An isolation region 15 defines the active region 11 in the semiconductor substrate 10.

The buried contacts 61 penetrate through the second dielectric layer 35 in plug form passing apart from the bit lines 51 and 52. A capping isolation layer 56 is formed on the bit lines 51 and 52 and a spacer 57 is formed on the sidewalls of the bit lines 51 and 52 so that the bit lines 51 and 52 are isolated from the buried contacts 61. The buried contact pads 41 are connected to the semiconductor substrate 10, passing between gates 22 and 23. Capping dielectric layers 26 are formed on the gates 22 and 23 and spacers 27 are formed on the sidewalls of the gates 22 and 23 so that the gates 22 and 23 are insulated from the buried contact pads 41. The bit lines 51 and 52 are electrically connected to the semiconductor substrate 10 via a direct contact 55 penetrating through a second dielectric layer 35 and a direct contact pad 45 penetrating the first dielectric layer 31.

However, as the minimum critical dimensions of semiconductor devices get smaller, an overlay margin or a misalignment margin between layers is reduced. Accordingly, it may be difficult to obtain the necessary process margins. For example, in area A of FIG. 1, if a small misalignment occurs in a state of a small process margin, one of the buried contacts 61 may lie very close to the direct contact pad 45 for the bit lines 51 and 52. As a result, in area A, a pattern bridge, or an electrical bridge, may be created between the direct contact pad 45 and one of the buried contacts 61.

Accordingly, to avoid a pattern bridge, or electrical bridge, a sufficient process margin or an alignment margin should be obtained between the direction contact pad 45 and one of the buried contacts 61. However, if the sizes of the buried contacts 61 are reduced in an attempt to obtain the alignment margin, their contact resistance may increase unacceptably and may deteriorate performance of the semiconductor device. Accordingly, limitations may exist to reducing the sizes of the buried contacts 61 to obtain alignment margins.

A pattern bridge or electrical bridge may also hinder an attempt to change the arrangement of the storage nodes 60. Currently, the storage nodes 60 extend and are repeated in a longitudinal direction. However, as the minimum critical dimension of a semiconductor device decreases, a gap between nodes 60 may become insufficient, and a pattern bridge or electrical bridge may occur between the storage nodes 60.

SUMMARY OF THE INVENTION

Embodiments of the present invention provide semiconductor devices and methods for manufacturing semiconductor devices. According to some embodiments, a semiconductor device includes a first insulating layer. First contact pads and second contact pads penetrate through the first insulating layer and are electrically connected to the semiconductor substrate. A second insulating layer on the first insulating layer defines guide contact holes having sidewalls that expose upper surfaces of the first contact pads. An etch stopper on the second insulating layer covers at least portions of the sidewalls of the guide contact holes. Bit lines electrically connect to the semiconductor substrate through the second contact pads. The bit lines are electrically isolated from the first contact pads. In further embodiments, a third insulating layer may be on the etch stopper and the bits lines may be on the third insulating layer opposite to the second insulating layer. Second contacts may penetrate through the third insulating layer and electrically connect to the second contact pads. The second contacts may electrically connect the bits lines to the second contact pads. A fourth insulating layer may cover the bit lines. First contacts may penetrate through the third and fourth insulating layers, and extend through the guide contact holes to electrically connect to the first contact pads. The first contacts may be electrically insulated from the second contact pads by the second insulating layer. Storage nodes may be on the fourth insulating layer and be electrically connected to the first contacts.

When misalignment occurs during manufacturing of the semiconductor device, and in particular, misalignment that may occur between the first contacts and the first contact pads, the guide contact holes and the etch stopper may prevent an electrical bridge between the first contacts and the second contact pads. Accordingly, greater misalignment during manufacturing may be tolerated, and which may thereby allow further reduction in the size of the semiconductor device.

According to other embodiments of the present invention, a semiconductor device include first insulating layer on a semiconductor substrate. First contact pads and second contact pads penetrate through the first insulating layer and are electrically connected to the semiconductor substrate. A second insulating layer is on the first insulating layer, and defines guide contact holes having sidewalls that expose upper surfaces of the first contact pads. Landing pads are in the guide contact holes and are electrically connected to the first contact pads. An etch stopper is on the second insulating layer. Bit lines are electrically connected to the semiconductor substrate through the second contact pads. The bit lines are electrically isolated from the first contact pads and the conductive landing pads.

When misalignment occurs during manufacturing of the semiconductor device, the landing pads and etch stopper may prevent an electrical bridge between the first contact pads and the second contact pads.

According to some other embodiments of the present invention a first insulating layer is formed on a semiconductor substrate. First contact pads and second contact pads are formed that penetrate through the first insulating layer and are electrically connected to the semiconductor substrate. A second insulating layer is formed that has guide contact holes that expose upper surfaces of the first contact pads. An etch stopper is formed on bottoms and sidewalls of the guide contact holes of the second insulating layer. Bit lines are formed that are electrically connected to the semiconductor substrate by the second contact pads. The bit lines are electrically isolated from the first contact pads.

According to other embodiments of the present invention, a first insulating layer is formed on a semiconductor substrate. First contact pads and second contact pads are formed that penetrate through the first insulating layer and are electrically connected to the semiconductor substrate. A second insulating layer is formed that has guide contact holes that expose upper surfaces of the first contact pads. Landing pads are formed in the guide contact holes and are electrically connected to the first contact pads. An etch stopper is formed on the landing pads and the second insulating layer. Bit lines are formed that are electrically connected to the semiconductor substrate by the second contact pads. The bit lines are electrically isolated from the first contact pads.

BRIEF DESCRIPTION OF THE DRAWINGS

FIGS. 30 and 31 are a schematic plan view and a cross-sectional view illustrating a semiconductor device including storage nodes, and a method of manufacturing the same according to third embodiments of the present invention

DETAILED DESCRIPTION OF THE INVENTION

Figure 1:
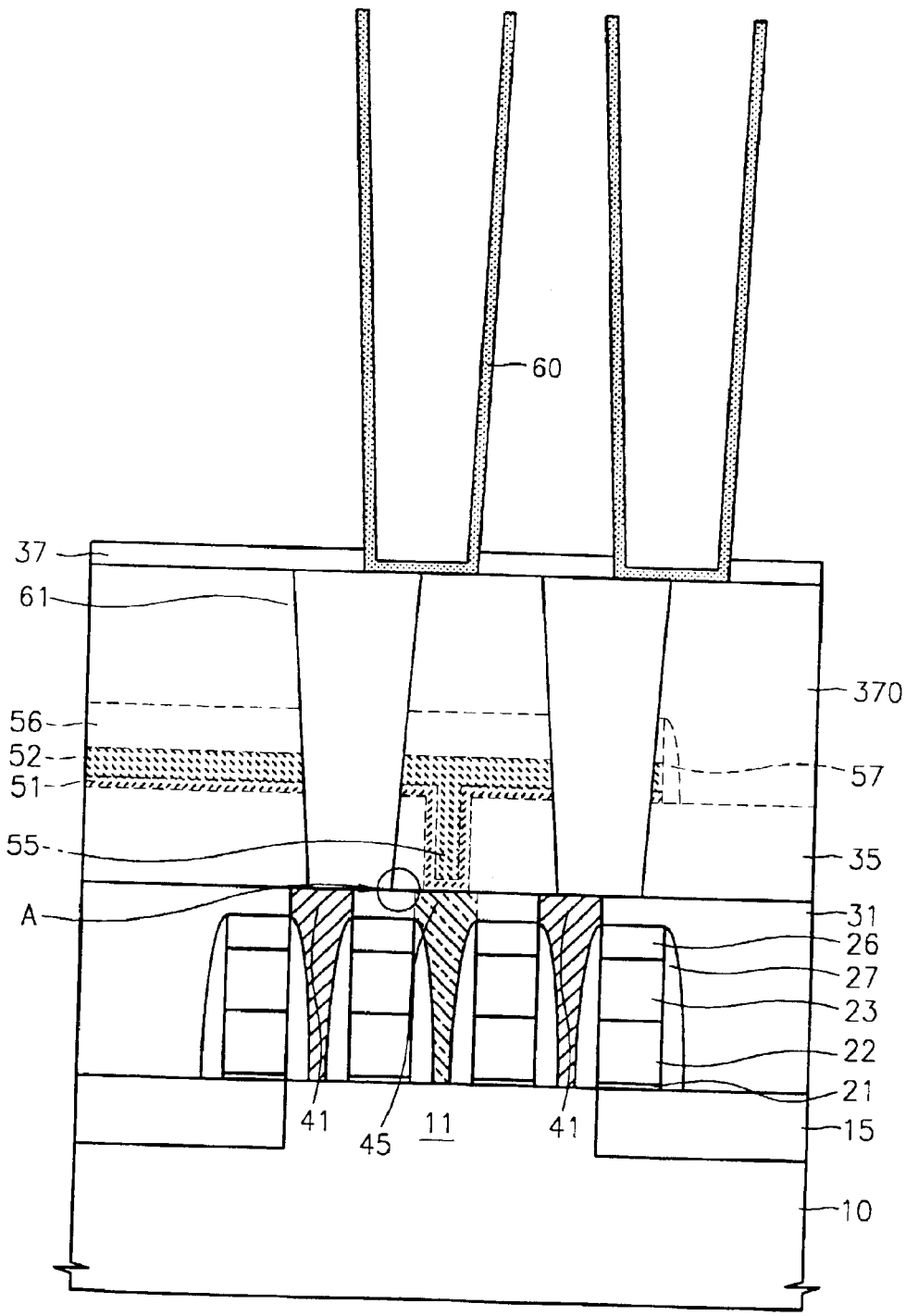
FIG. 1 is a schematic cross-sectional view illustrated a semiconductor substrate including conventional storage nodes.

The present invention now will be described more fully hereinafter with reference to the accompanying figures, in which embodiments of the invention are shown. This invention should not be construed as limited to the embodiments set forth herein. Accordingly, specific embodiments thereof are shown by way of example in the drawings and will herein be described in detail. It should be understood, however, that there is no intent to limit the invention to the particular forms disclosed. Like numbers refer to like elements throughout the description of the figures. In the figures, the dimensions of layers and regions may be exaggerated for clarity. It will also be understood that when an element, such as a layer, region or substrate, is referred to as being "on" another element, it can be directly on the other element or intervening elements may also be present. In contrast, when an element, such as a layer, region or substrate, is referred to as being "directly on" another element, there are no intervening elements present.

First Embodiments

In some first embodiments of the present invention, after buried contact pads are introduced and before buried contacts connected to the buried contact pads are formed, an additional insulating layer, which covers the buried contact pads, is introduced. Guide contact holes are formed in the insulating layer that expose upper surfaces of the buried contact pads. Then, an etch stopper is formed on the insulating layer and the guide holes.

FIGS. 2 through 18 are schematic cross-sectional views that illustrate a method for manufacturing a semiconductor device with storage nodes according to first embodiments of the present invention.

Figure 2:
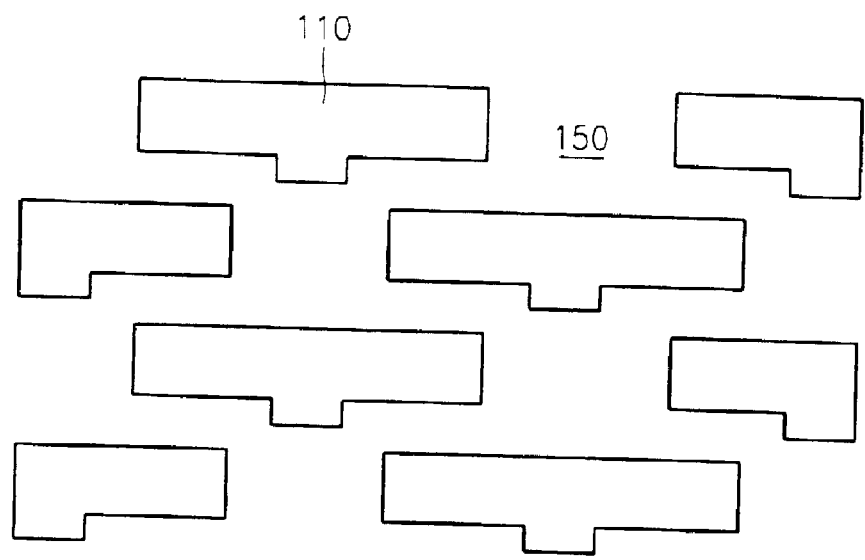
FIGS. 2 through 18 are schematic plan views and cross-sectional views illustrating a semiconductor device including storage nodes, and a method of manufacturing the same according to first embodiments of the present invention.
Figure 3:
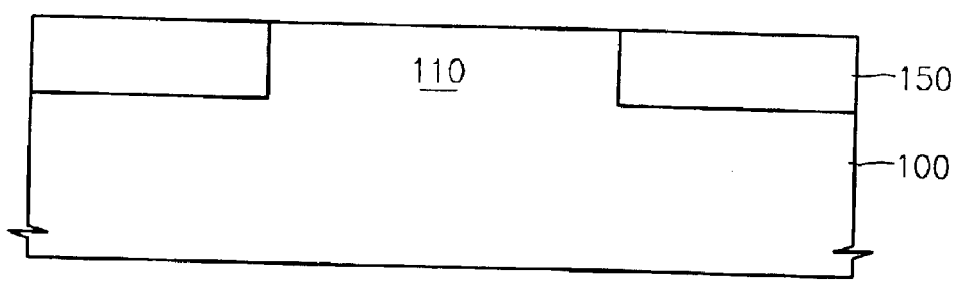

FIG. 2 is a plan view that shows an active region formed in a semiconductor substrate. FIG. 3 is a cross-sectional view that shows the active region of FIG. 1 in a longitudinal direction. An isolation region 150, such as a trench isolation region, is formed in a semiconductor substrate 100 made of silicon by performing an isolation process. Here, a trench may be formed to a depth of about 2500–3000 Å. An active region 110 is formed in the semiconductor substrate 100 by the isolation region 150. The active region 100 may be T-shaped to increase the density of the semiconductor device.

A photolithography process and an ion implantation process may be performed to form wells and channels of transistors in the semiconductor substrate 100.

Figure 4:
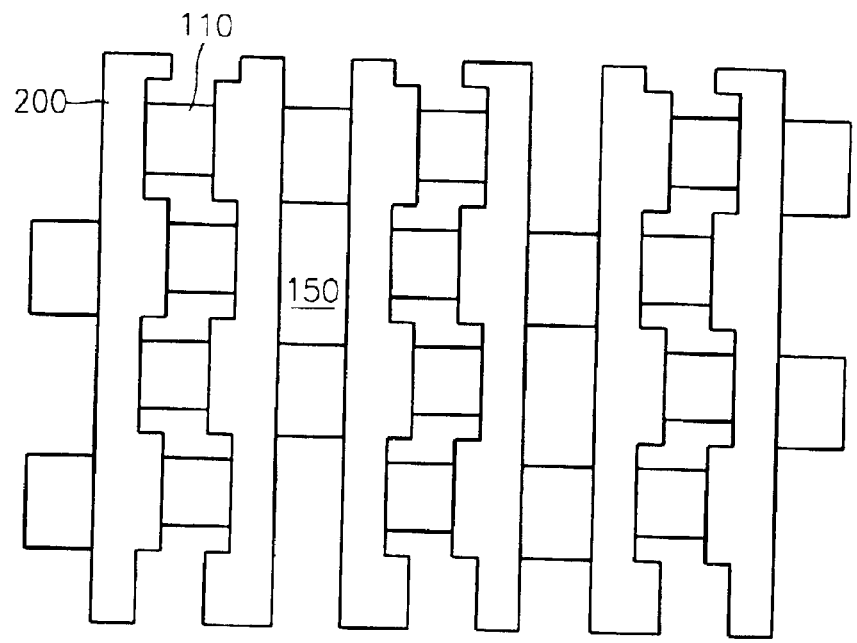
Figure 5:
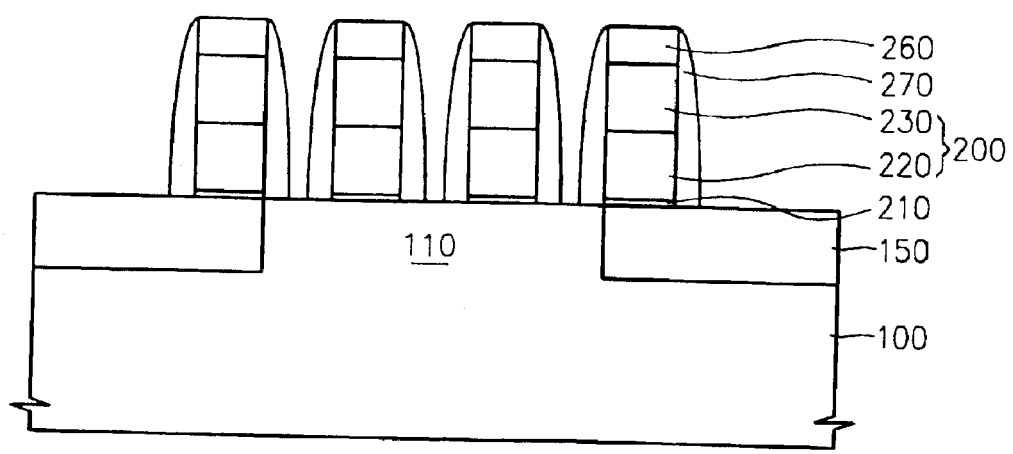

FIGS. 4 and 5 are a plan view and a cross-sectional view that illustrate gate lines formed on the semiconductor substrate 100. A plurality of gate patterns 200 may be formed in a line crossing the active region 110. In particular, an oxide layer (not shown), which may be formed as a buffer to implant ions into the active region 110, may be removed using wet etch. Next, a thermal oxide layer may be grown on the active region 110 to a thickness of about 40–60 Å to form gate oxide layers 210. The thicknesses of the gate oxide layers 210 may vary depending on the characteristics of the semiconductor device.

Gate layers 220 and 230 and gate capping insulating layers 260 may be sequentially formed on the gate oxide layers 210. The gate layers 220 and 230 may be formed by depositing conductive layers. For example, a doped polysilicon layer 220 having conductivity is deposited to a thickness of about 1000 Å, and then a metal silicide layer 230, e.g., a tungsten silicide layer, may be formed on the doped polysilicon layer 220 to a thickness of about 1000 Å to improve the conductivity of the doped polysilicon layer 220. A silicon nitride layer may be deposited on the tungsten silicide layer 230 to a thickness of about 2000 Å as the capping insulating layer 260 to protect gates from a subsequent etching process.

The capping insulating layer 260 and gate layers 220 and 230 may be sequentially patterned by performing a photo and etching process to form a plurality of gate patterns 200 crossing the active region 110 as shown in FIG. 4. Source and drain regions of transistors having a lightly doped drain structure may be formed depending on the characteristics and areas of transistors such as NMOS transistors or PMOS transistors using a photolithography process and an implantation process.

An insulating layer covering the gate patterns 200 may be deposited and etched to form gate spacers 270. The gate spacers 270 may be formed of a silicon nitride layer and protect the sidewalls of the gate patterns 200.

Figure 6:
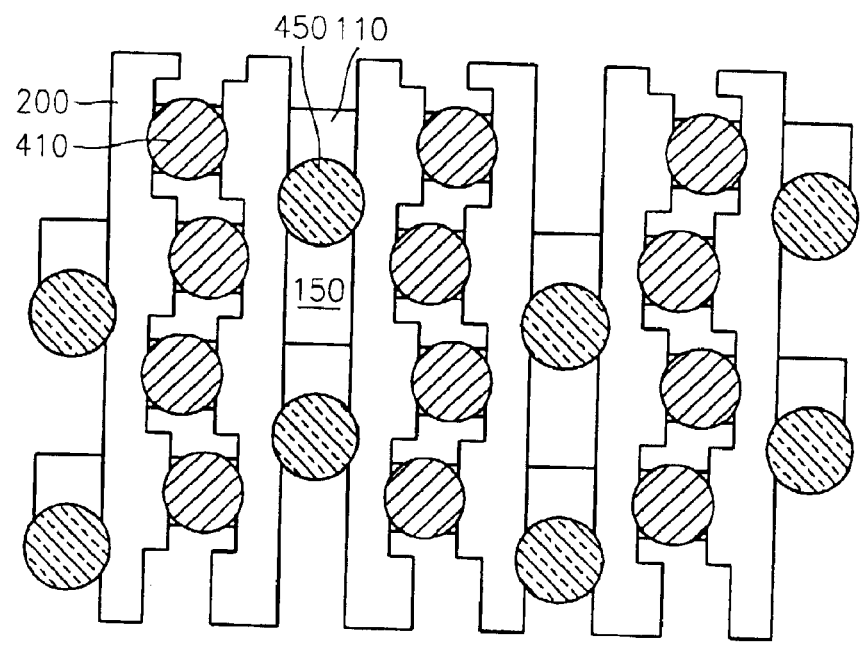
Figure 7:
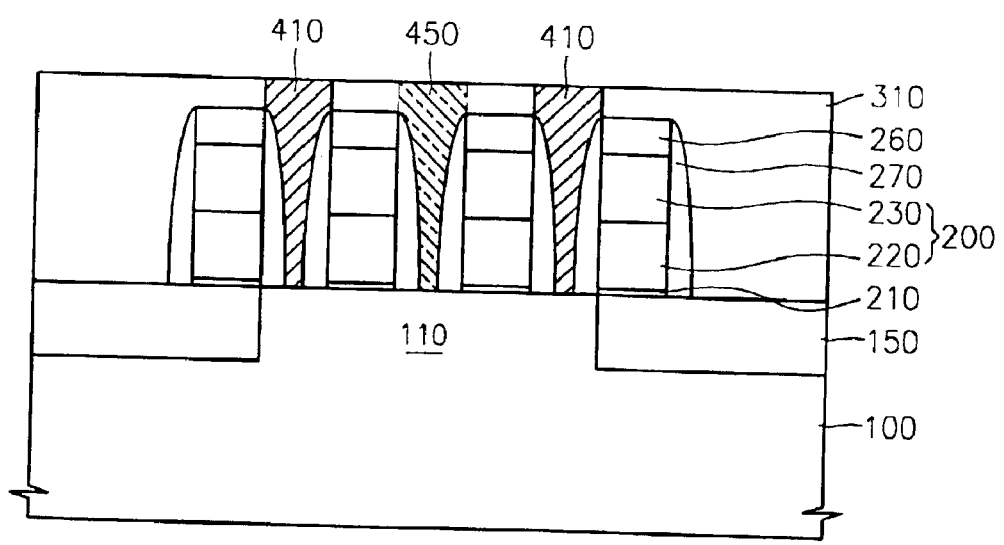

FIGS. 6 and 7 are a plan view and a cross-sectional view that illustrate contact pads 410 and 450. A first insulating layer 310, which at least partially fills gaps between the gat patterns 200, may be formed. The first insulating layer 310 may be formed of a silicon oxide having a good gap-filling characteristic such as high-density plasma (HDP) oxide, borophosphosilicate glass (BPSG), Tosz, or the like. The upper surface of the first insulating layer 310 may be planarized. This planarization process may be performed using chemical mechanical polishing (CMP) or the like.

A plurality of contact pads 410 and 450 may be formed in the first insulating layer 310 using a self-aligned contact (SAC) process. The contact pads 410 and 450 can be classified into the first contact pads 410, which are prepared for electrical connection to storage nodes, and the second contact pads 450, which are prepared for electrical connection to buried contact pads and bit lines, i.e., a direct contact pad. Essentially, the first contact pads 410 and the second contact pad 450 may be positioned in a slanting direction, placing the gate patterns 200 therebetween.

In a process of forming the contact pads 410 and 450, portions of the first insulating layer 310 in which bit line contacts and storage node contacts will be formed may be selectively etched using a photolithography process and a selective etching process to form contact holes for contact pads so that portions of the active region 110 are exposed. Ions may be implanted into the exposed portions of the active region 110 to lower contact resistance between the active region 110 and the contact pads 410 and 450. A conductive material, such as doped polysilicon containing N-type impurities, may be deposited to a thickness of about 2500 Å to fill the contact holes. The conductive layer may be dry etched using etch back or CMP to expose the upper surface of the first insulating layer 310. Contact pads 410 and 450 are formed to fill the contact holes.

Figure 8:
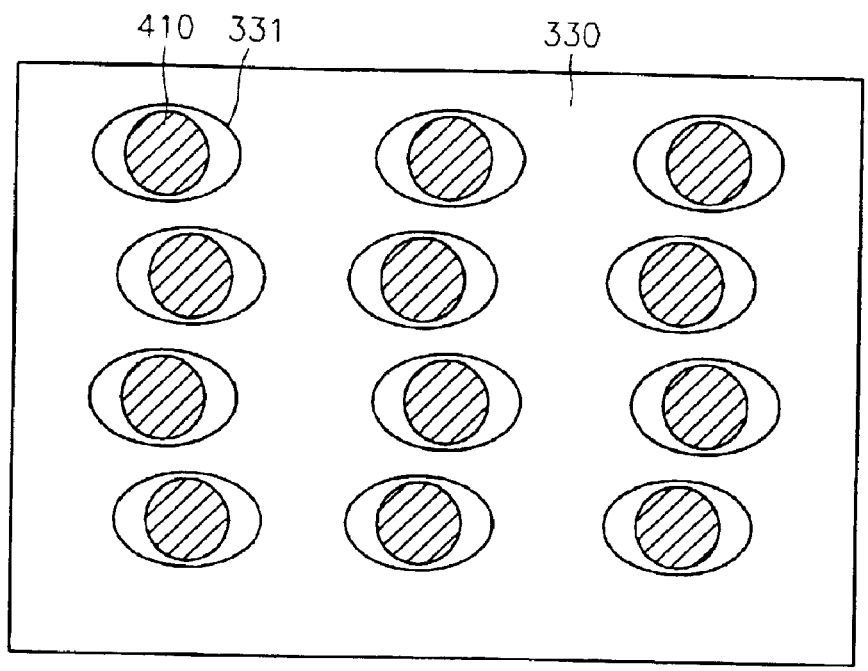
Figure 9:
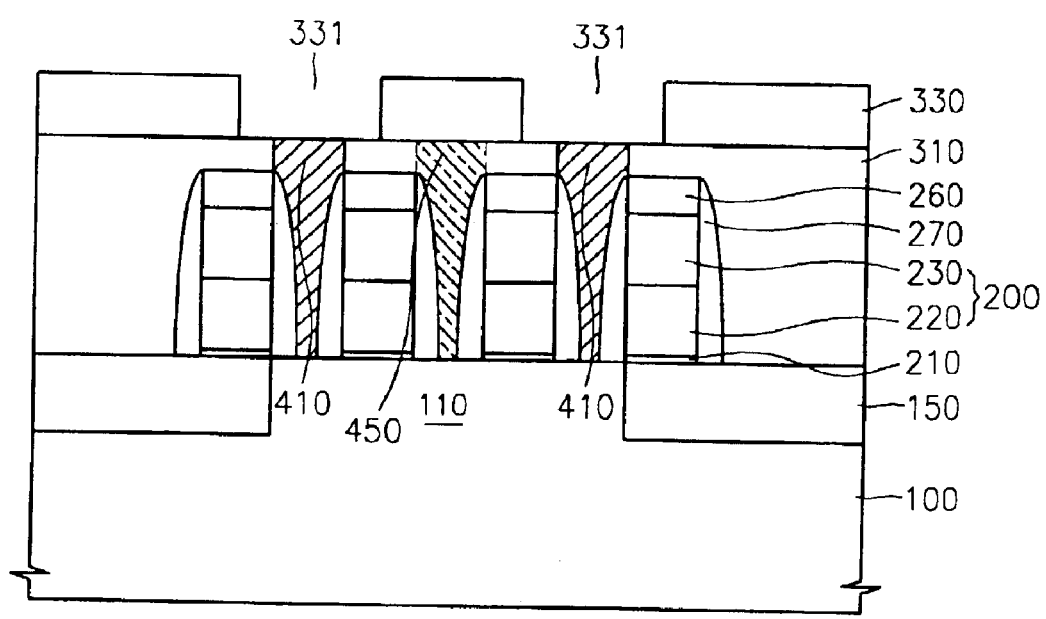

FIGS. 8 and 9 are a plan view and a cross-sectional view that illustrate a second insulating layer having guide contact holes exposing contact pads. Referring to FIGS. 8 and 9, a second insulating layer 330, which covers the contact pads 410 and 450, may be formed on the first insulating layer 310. The second insulating layer 330 may be formed to make patterns on an additional layer which protects the creation of pattern bridges or electrical bridges between first contacts connected to the first contact pads 410 and the second contact pad 450. For example, the second insulating layer 330 is formed by depositing silicon oxide on the first insulating layer 310 to a thickness of about 1000 Å.

The second insulating layer 330 may be selectively etched using a photolithography process and a dry etching process to form guide contact holes 331 so that the first contact pads 410, which are buried contact pads, are exposed. The guide contact holes 331 may have a wider width or size than that of the upper surfaces of the first contact pads 410 so that the guide contact holes 331 are wider than the widths of contacts, e.g., buried contacts, that will be connected to the first contact pads 410.

Because the guide contact holes 331 are formed so as to expose the first contact pads 410, the guide contact holes 331 may be essentially formed only in the cell array region of the semiconductor substrate 100.

Figure 10:
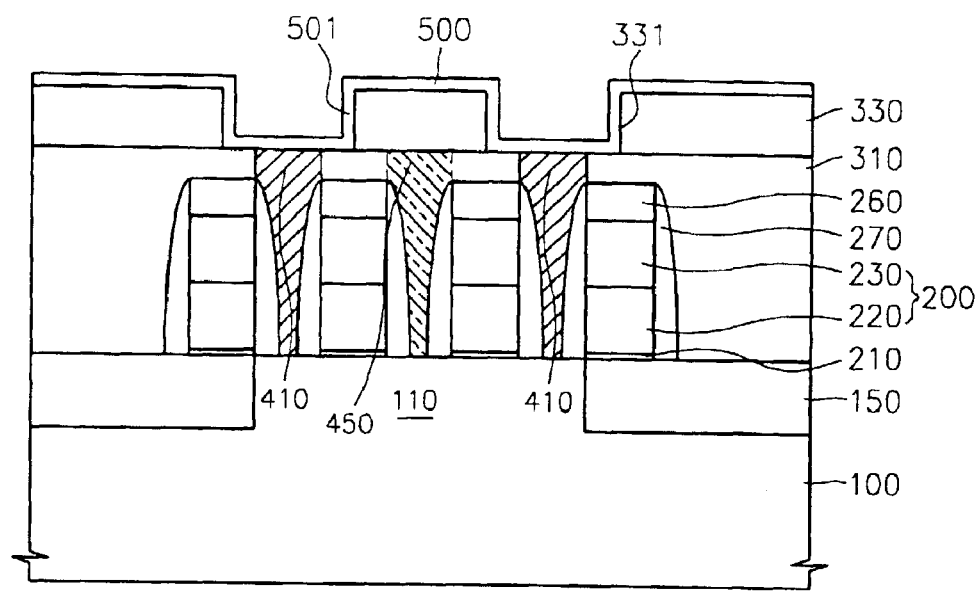

FIG. 10 is a cross-sectional view that illustrates an etch stopper formed on the second insulating layer 330. Referring to FIG. 10, an etch stopper 500 may be formed on the second insulating layer 330. The etch stopper 500 may have a relatively thin linear shape which curves onto the first contact pads 410 in a nest shape due to the guide contact holes 331. In other words, because the etch stopper 500 may be deposited along the sidewalls of the guide contact holes 331, a nest shape 501 is formed. The nest shape 501 of the etch stopper 500 may serve to insulate the second contact pad 450 from the buried contacts.

The etch stopper 500 may be formed of a material having good etch selectivity to a material forming a third insulating layer that will be deposited later, e.g., silicon nitride having good etch selectivity to silicon oxide. The etch stopper 500 may be formed to a thickness of about 200 Å. The maximum thickness of the etch stopper 500 may be set, or may vary depending upon gaps between the guide contact holes 331 and the second contact pad 450, contact resistance of the storage nodes, an etch stopping characteristic, or the like.

Figure 11:
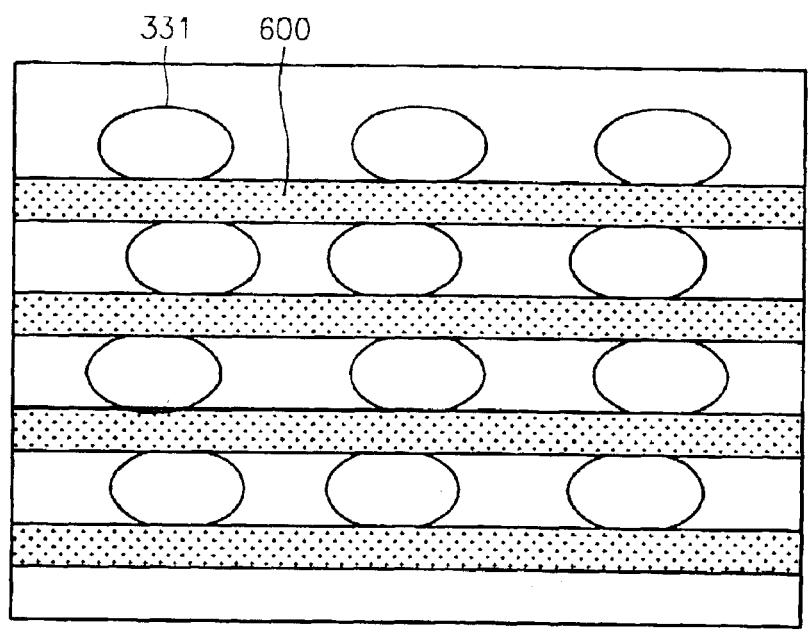
Figure 12:
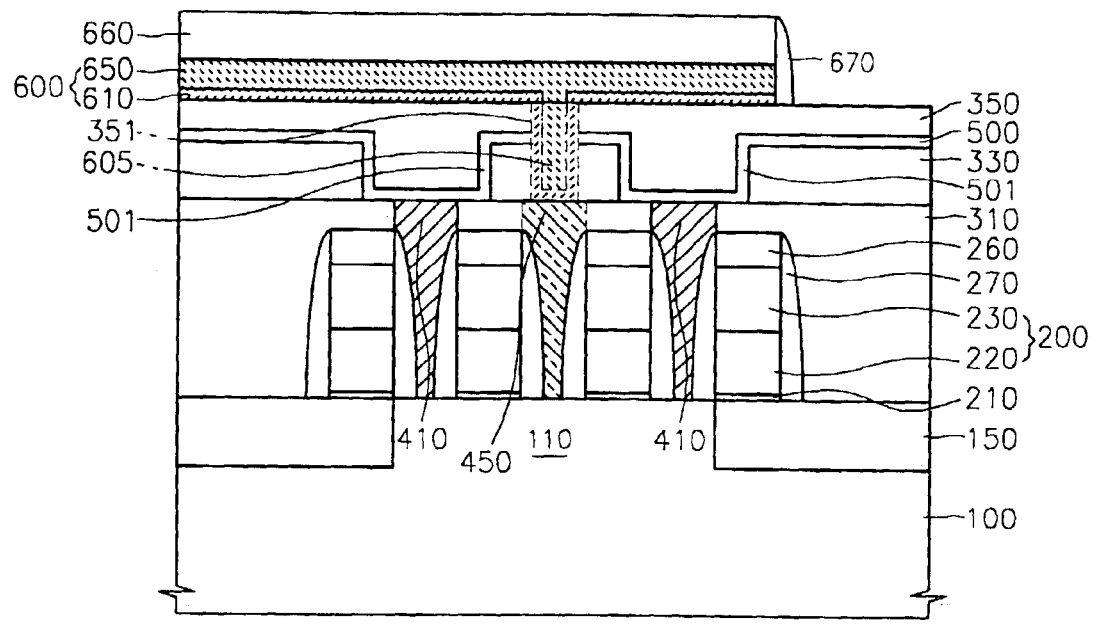

FIGS. 11 and 12 are a plan view and a cross-sectional view that illustrate bit lines. Referring to FIGS. 11 and 12, a third insulating layer 350 may be deposited on the etch stopper 500. The third insulating layer 350 may be deposited to a thickness that fully fills the guide holes 331. For example, the third insulating layer 350 may be formed by depositing silicon oxide to a thickness of about 1000 Å.

As shown in FIG. 12, for a second contact, a second contact hole 351, which penetrates through the third insulating layer 350, the etch stopper 500, and the second insulating layer 330, may be formed to expose the upper surface of the second contact pad 450, i.e., the direct contact pad. The second contact hole 351 may be formed using a photolithography process and an etching process.

Bit lines 600, which are connected by a second contact 605 to the second contact pad 450, may be formed using a bit line formation process. For example, a barrier metal layer 610 and a metal conductive layer 650, such as a tungsten layer, may be deposited and patterned to form the bit lines 600. Here, the second contact 605 may be formed to fill the second contact hole 351. In other words, the second contact 605, i.e., a direct contact, electrically connects the bit lines 600 to the second contact pad 450.

A capping insulating layer 660 may be formed of a silicon nitride layer on the bit lines 600. Bit line spacers 670 may be formed of a silicon nitride layer on the sidewalls of the bit lines 600. The capping insulating layer 660 and the spacer 670 may be prepared to perform a SAC process necessary for securing a process margin in a subsequent process of forming storage node contacts.

Figure 13:
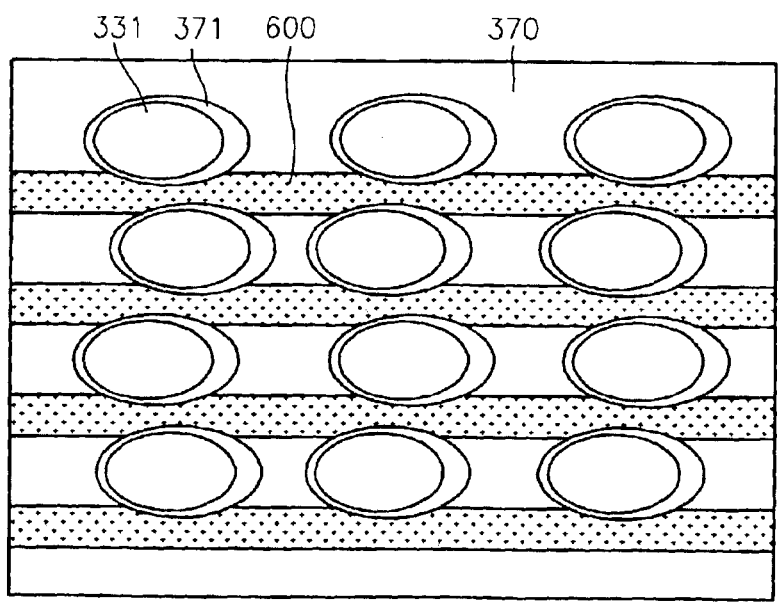
Figure 14:
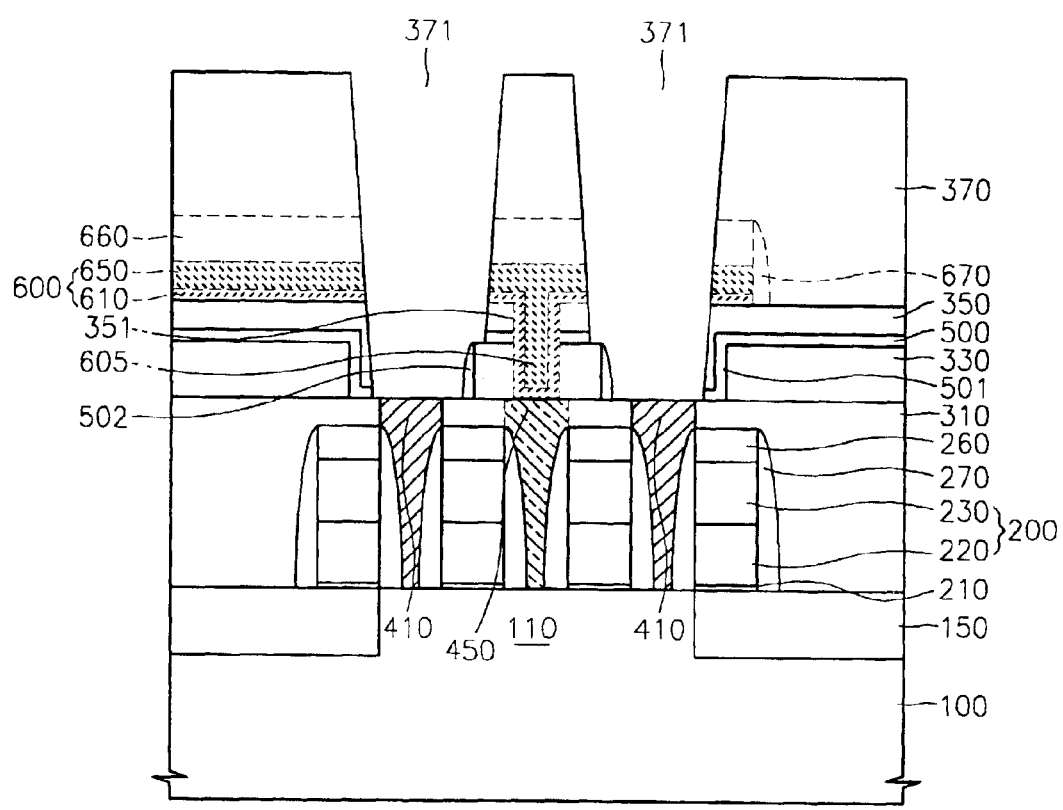

FIGS. 13 and 14 are a plan view and a cross-sectional view that illustrate a fourth insulating layer having contact holes for storage node contacts. A fourth insulating layer 370 may be formed to cover the bit lines 600. For example, the fourth insulating layer 370 is formed by depositing silicon oxide such as HDP oxide, BPSG, Tosz, or the like having a good gap-filling characteristic. The surface of the fourth insulating layer 370 may be planarized by a planarization process that may be performed using CMP. The fourth insulating layer 370 may be selectively etched using a photolithography process and a selective etching process to form first contact holes 371 exposing the surfaces of the first contact pads 410. The first contact holes 371 may be prepared to form storage node contacts, i.e., first contacts.

The etch stopper 500 stops the selective etching process. Thereafter, the first contact holes 371 may be overetched to expose the first contact pads 410.

Here, even though the first contact holes 371 deviate from the first contact pads 410, the first contact holes 371 may be better insulated from the second contact pad 450 due to the guide contact holes 331 and the resulting nest shape 501 of the etch stopper 500. Accordingly, if the first contact holes 371 slightly deviate from the first contact pads 410, the first contact holes 371 may be precluded from extending to overly, and electrically connect to, the second contact pad 450.

In particular, as shown in FIG. 14, if the first contact holes 371 deviate from the first contact pads 410, portions of the etch stopper 500 around the corners of the guide contact holes 331 are exposed due to the etching process for forming the first contact holes 371. However, because the etch stopper 500 is formed of a material resistant to the etching process, the exposed portions of the etch stopper 500 are protected.

Accordingly, portions of the second insulating layer 330 forming the sidewalls of the guide contact holes 331 may not be eroded during the etching process for forming the first contact holes 371. The exposed portions of the etch stopper 500 are removed while the portions of the second insulating layer 330 forming the sidewalls of the first contact holes 371 remain. In this manner, the second insulating layer 330 remains to separate, and insulate therefrom, the second contact pad 450 from the first contact holes 371.

If the first contact holes 371 are misaligned with the first contact pads 410, a pattern bridge may be effectively prevented from forming between a buried contact formed in the first contact holes 371 and the second contact 605 for the bit lines 600 or the second contact pad 450. Accordingly, a process margin, an overlay margin, or a misaligned margin may be sufficiently obtained when forming the first contact holes 371. As a result, the widths of the first contact holes 371 and the storage node contacts, which may be formed in the first contact holes 371 (, i.e., first contacts) may be formed with a larger critical dimension. Thus, contact resistance of the storage node contacts may be lowered.

Etch stopper portions 502 of the etch stopper 500 exposed in the process of etching the first contact holes 371 and formed on the sidewalls of the guide contact holes 331 remain as spacers covering the sidewalls of the guide contact holes 331. The etch stopper portions 502 may serve to insulate the first contact holes 371 from the second contact pad 450.

Figure 15:
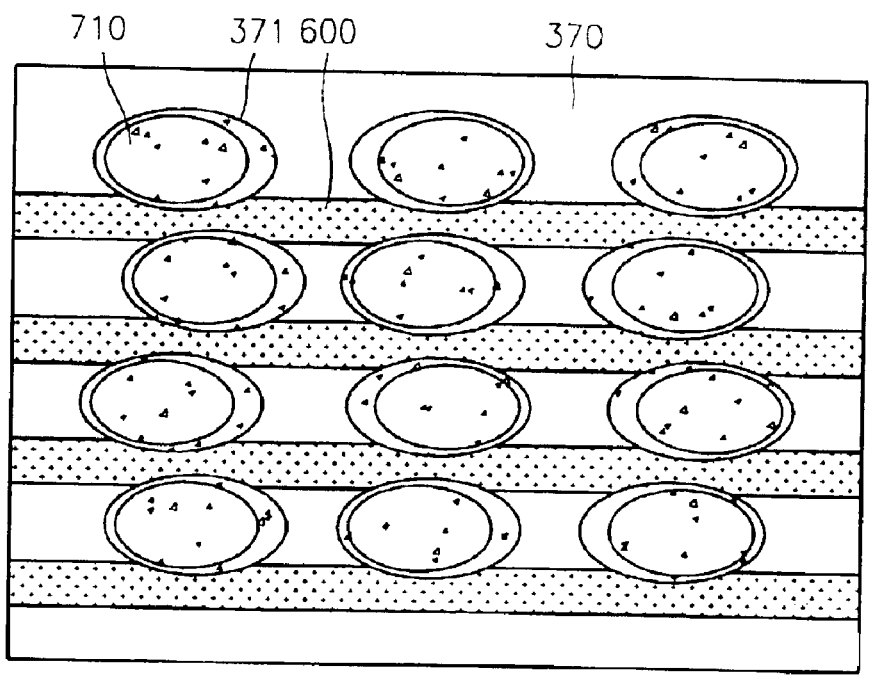
Figure 16:
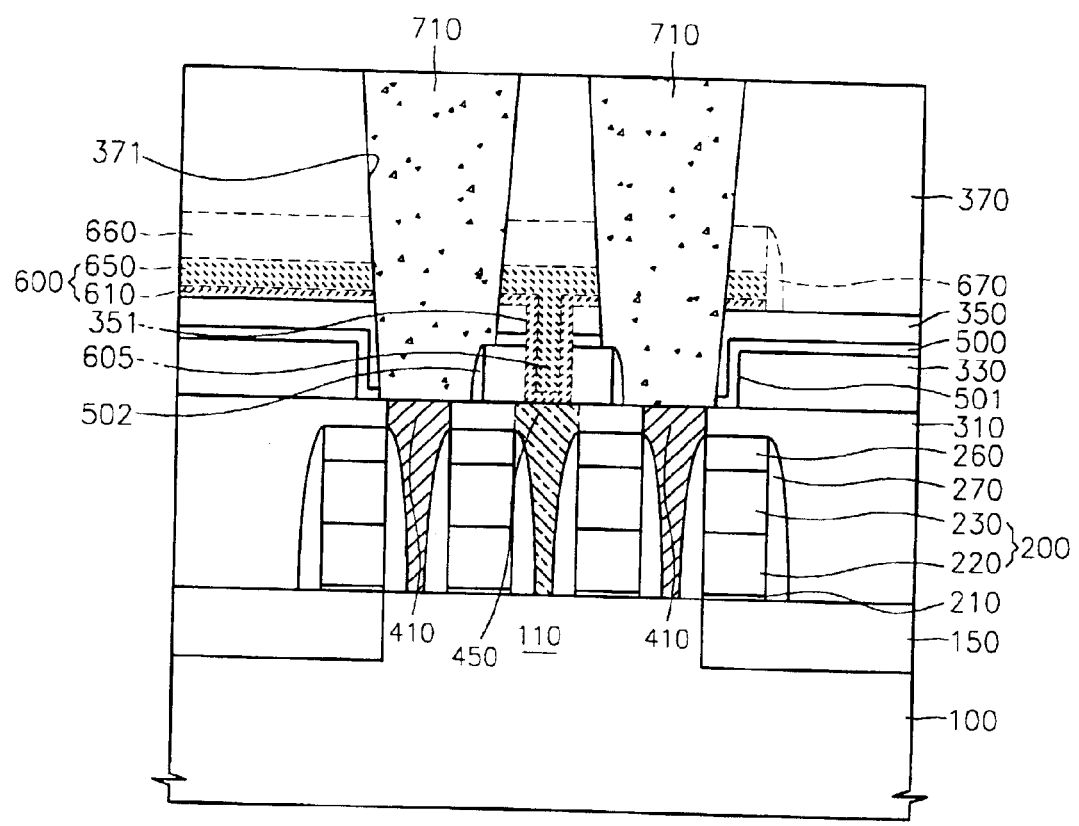

FIGS. 15 and 16 are a plan view and a cross-sectional view that illustrate storage node contacts. A conductive layer, e.g., a conductive polysilicon layer, may be formed to at least partially fill the first contact holes 371. The conductive polysilicon layer may be formed to a thickness of about 2000 Å using chemical vapor deposition (CVD). The conductive layer may be planarized using etch back or CMP to form first contacts 710, i.e., storage node contacts, which at least partially fill the first contact holes 371 and are connected to the first contact pads 410. Here, the first contacts 710 may be formed to a wider critical dimension due to the second insulating layer 330, the guide contact holes 331, the etch stopper 500, and so forth. In particular, the first contacts 710 may extend in a longitudinal direction in which the bit lines 600 extend.

Accordingly, a larger margin may be allowed in positioning the arrangement of storage nodes which will be connected to the first contacts 710. Because critical dimensions of the first contact holes 710 are expanded, a larger critical dimension may be allowed in positioning the arrangement of the storage nodes. For example, when the storage nodes greatly deviate from the center of the first contacts 710, sufficient contact area between the storage nodes with the first contacts 710 may still be provided, resulting in an acceptable increase in contact resistance of the storage nodes. As illustrated by the plan view of FIG. 17, the storage nodes may be zigzagged in square shapes in accordance with the bit lines 600

Figure 17:
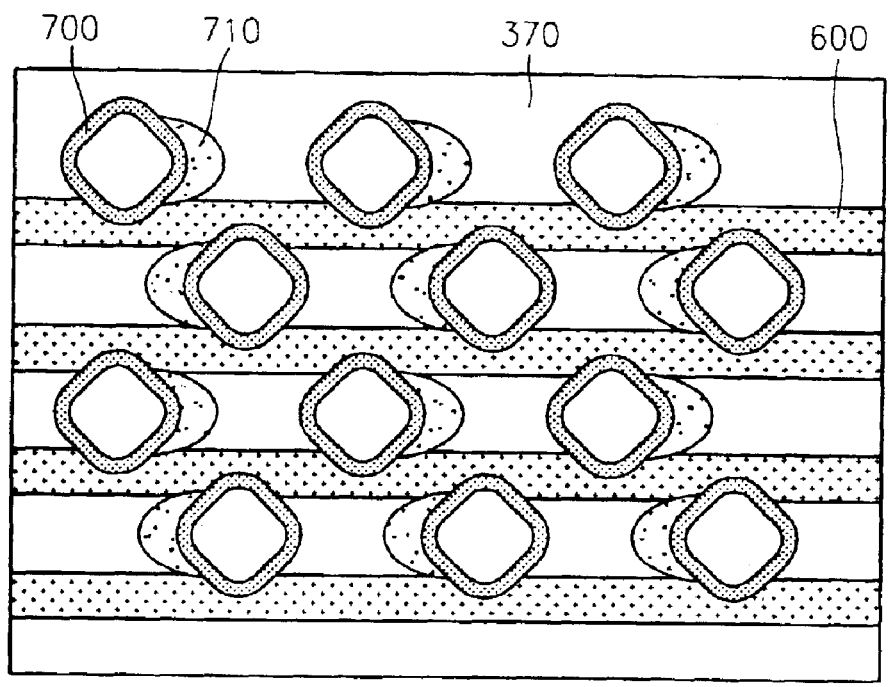
Figure 18:
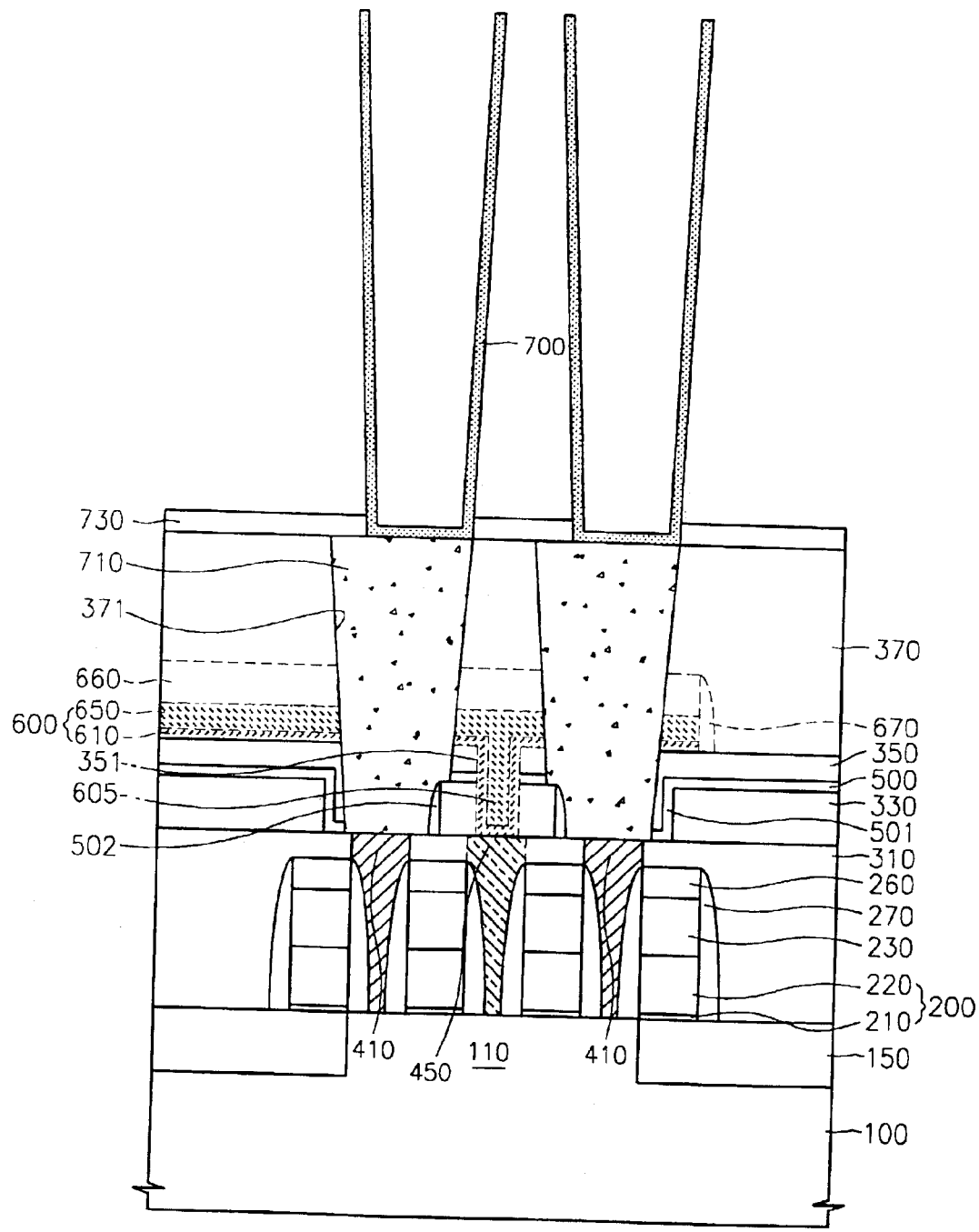

FIGS. 17 and 18 are a plan view and a cross-sectional view that illustrate storage nodes. Storage nodes 700 may be formed to be three-dimensional on the fourth insulating layer 370. The storage nodes 700 may be formed of a conductive material used for nodes of general capacitors, e.g., conductive polysilicon. Because the storage nodes 700 may be formed in a cylindrical shape as shown in FIG. 18, an effective area of a capacitor can be large.

A mold may be formed on the fourth insulating layer 370 to form the storage nodes 700 in three-dimensional form. A conductive layer may be formed along the mold and divided into the storage nodes 700 having the cylindrical shape. Thereafter, the mold may be selectively removed to complete the storage nodes 700. Here, a node support layer 730 is formed around lower portions of the storage nodes 700 to support the storage nodes 700 and prevent the storage nodes 700 from slanting.

As seen in the plan view of FIG. 17, the storage nodes 700 may be substantially square. The storage nodes 700 may be zigzagged in the longitudinal direction in which the bit lines 600 extend. Accordingly, gaps between the storage nodes 700 may be maximized. As a result, the integration density of the semiconductor device may increase and the minimum critical dimension of the semiconductor device may decrease, and prevent the creation of bridges between the storage nodes 700.

If the storage nodes 700 are arranged as shown in FIG. 17, the centers of the storage nodes 700 are misaligned with the centers of the first contacts 710. According to the present embodiments of the invention, the first contacts 710 may be formed with a greater width, so that contact resistance may be prevented from increasing or may increase by an acceptable amount.

The configuration of the first contacts 710 may be determined, and limited by, a bridge margin between a contact for a bit line, i.e., the second contact 605, and the first contacts 710. Also, bridge margins between patterns may be determined by a misalignment margin allowed in a photolithography process and/or etch skew that may occur during an etching process. However, because the first contacts 710 can extend in a wide manner, overlapping areas among the storage node contacts, i.e., the first contacts 710, the first contact pads 410, and the storage nodes 700, may increase. As a result, contact resistance may decrease.

Second Embodiments

In some second embodiments of the present invention, after buried contact pads are introduced and before buried contacts are connected to the buried contact pads, an additional insulating layer, which covers the buried contact pads, may be introduced. Guide contact holes, which expose upper surfaces of the buried contact pads, may be formed in the insulating layer. Landing pads may be formed to at least partially fill the guide contact holes, and an etch stopper may be formed on the landing pads. Reference numerals of the second embodiments that are the same as those of the first embodiments denote identical elements.

FIGS. 19 through 28 are schematic cross-sectional views that illustrate a method of manufacturing a semiconductor device having storage nodes according to the second embodiments of the present invention.

As in the first embodiments described with reference to FIGS. 2 through 9, first contact pads 410 and a second contact pad 450, which penetrate through a first insulating layer 310 and are connected to a semiconductor substrate 100, are formed. A second insulating layer 330 having guide contact holes 331 may be formed to expose the first contact pads 410.

Figure 19:
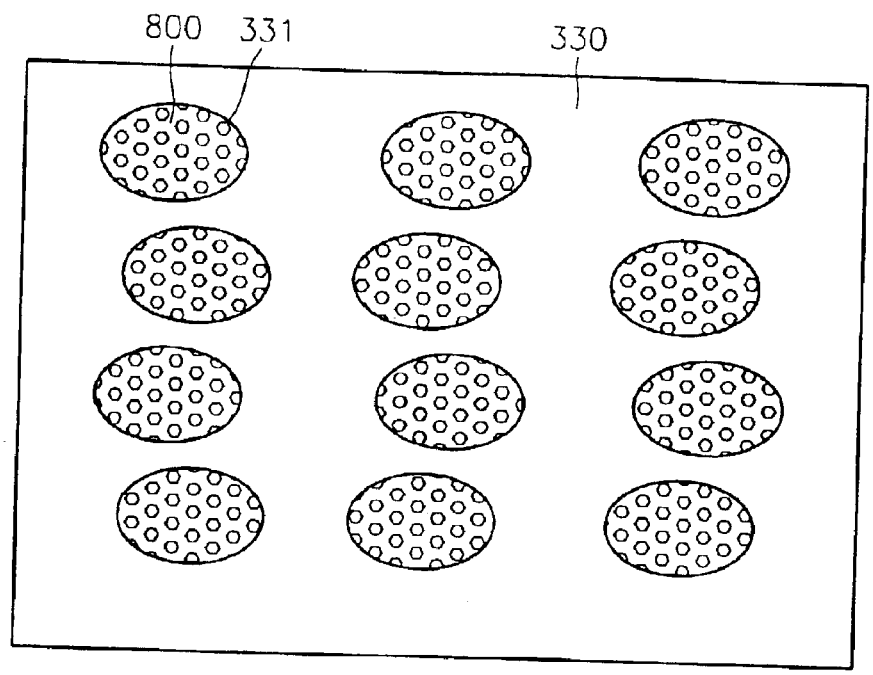
FIGS. 19 through 29 are schematic plan views and cross-sectional views illustrating a semiconductor device including storage nodes, and a method of manufacturing the same according to second embodiments of the present invention.
Figure 20:
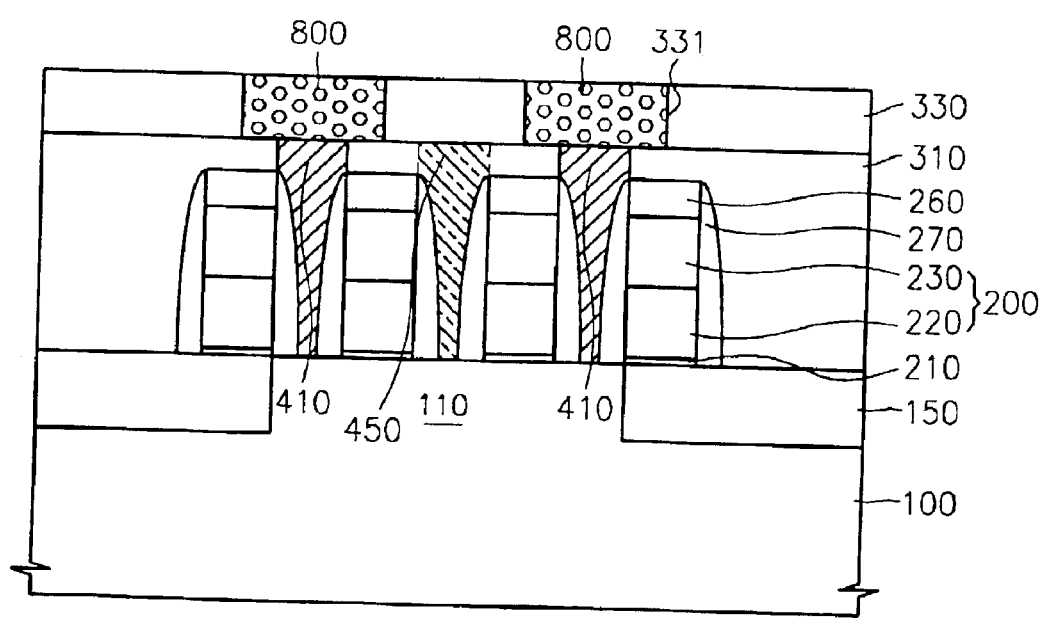

FIGS. 19 and 20 are a plan view and a cross-sectional view that illustrate land pads that at least partially fill guide contact holes. Guide contact holes 331 may be formed in the second insulating layer 330 wider than widths of the first contact pads 410. Landing pads 800 may be formed to at least partially fill the guide contact holes 331. For example, conductive polysilicon doped with N-type impurities may be deposited to a thickness of about 1500 Å and divided into pads using dry etch back or CMP to form the land pads 800. Thus, the landing pads 800 may be formed to the same height as the second insulating layer 330 and to widths wider than the first contact pads 410.

Figure 21:
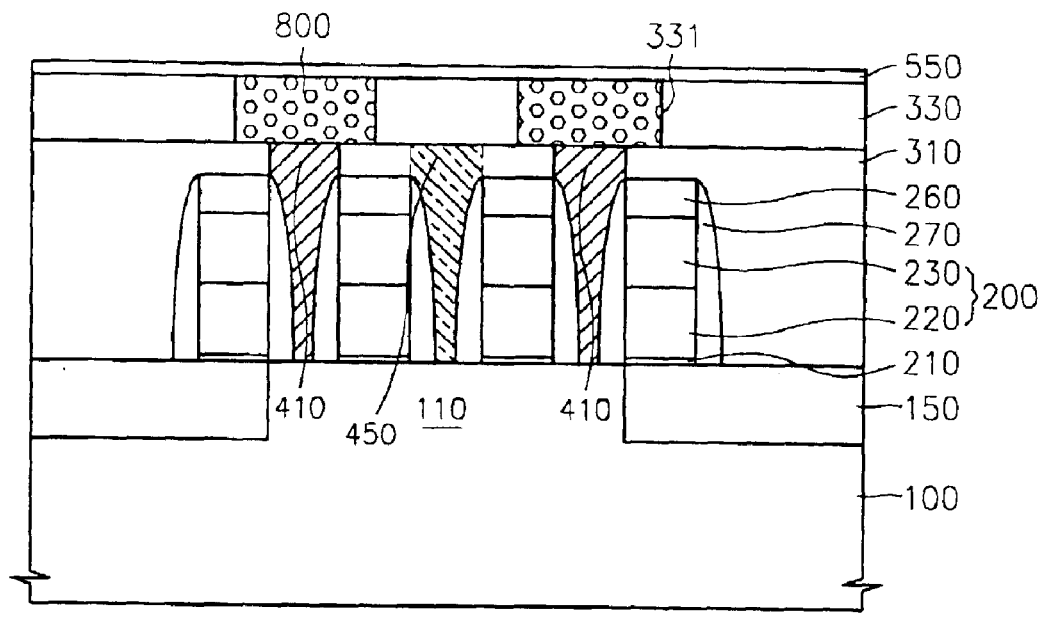

FIG. 21 is a cross-sectional view that illustrates an etch stopper formed on landing pads. An etch stopper 550 may be formed on the second insulating layer 330 to cover the landing pads 800. The etch stopper 550 may have a relatively linear shape which serves to insulate buried contacts, i.e., first contacts, from the second contact pad 450. The etch stopper 550 may be formed of a material having good etch selectivity to a material forming a third insulating layer that will be deposited later, e.g., silicon nitride having good etch selectivity to silicon oxide. The etch stopper 550 may be formed to a thickness of about 200 Å. The optimum thickness of the etch stopper 550 may be set, or may vary, in consideration of a contact resistance of the storage nodes, an etch stopping characteristic, or the like.

Figure 22:
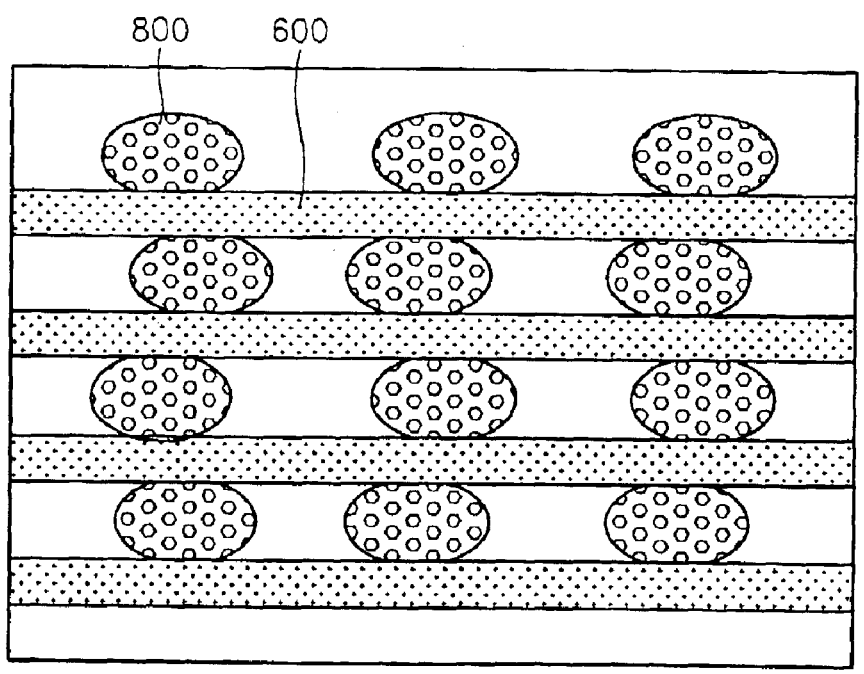
Figure 23:
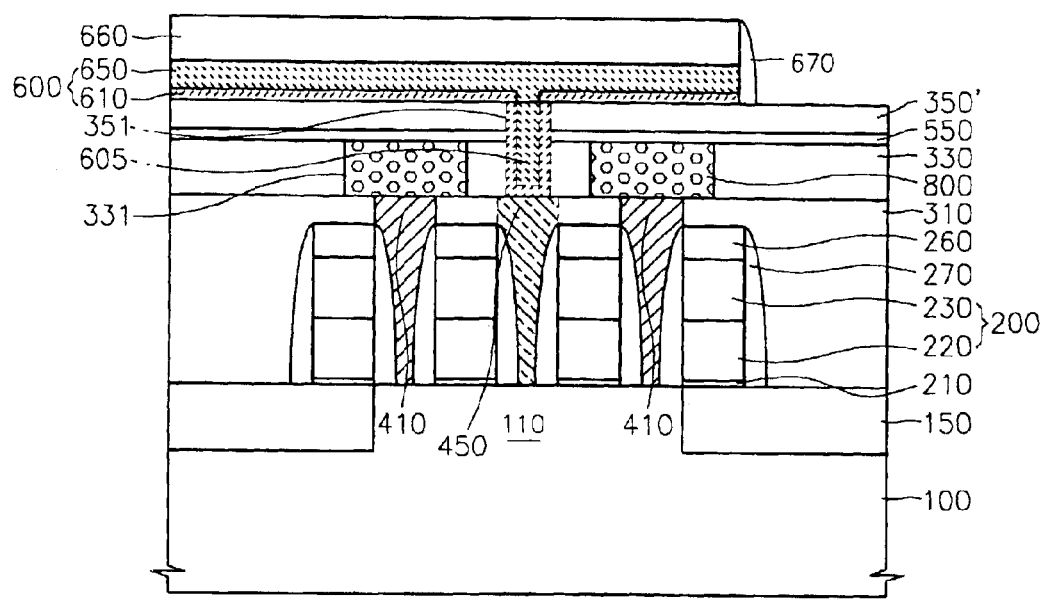

FIGS. 22 and 23 are a plan view and a cross-sectional view that illustrate bit lines. A third insulating layer 350 may be deposited on the etch stopper 550. For example, the third insulating layer 350 may be formed by depositing a silicon oxide layer to a thickness of about 1000 Å. Next, a contact hole 351, which penetrates through the third insulating layer 350, the etch stopper 550, and the second insulating layer 330, may be formed to expose the upper surface of the second contact pad 450.

Bit lines 600, which are electrically connected to the second contact pad 450, may be formed using a bit line formation process. For example, a barrier metal layer 610 and a metal conductive layer 650, such as a tungsten layer, may be deposited and patterned to form the bit lines 600. Here, a second contact 605, which fills the second contact hole 351, e.g., a direct contact, electrically connects the bit lines 600 and the second contact pad 450.

A bit line capping insulating layer 660 may be formed of a silicon nitride layer on the bit lines 600. A bit line spacer 670 may be formed on the sidewall of the bit lines 600. The bit line capping insulating layer 660 and the bit line spacer 670 are prepared to perform a SAC process so that a process margin is further secured when forming storage node contacts.

Figure 24:
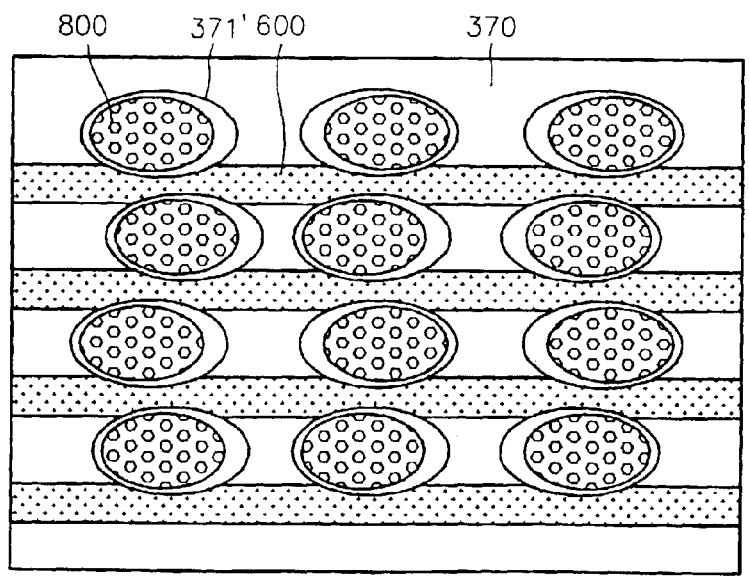
Figure 25:
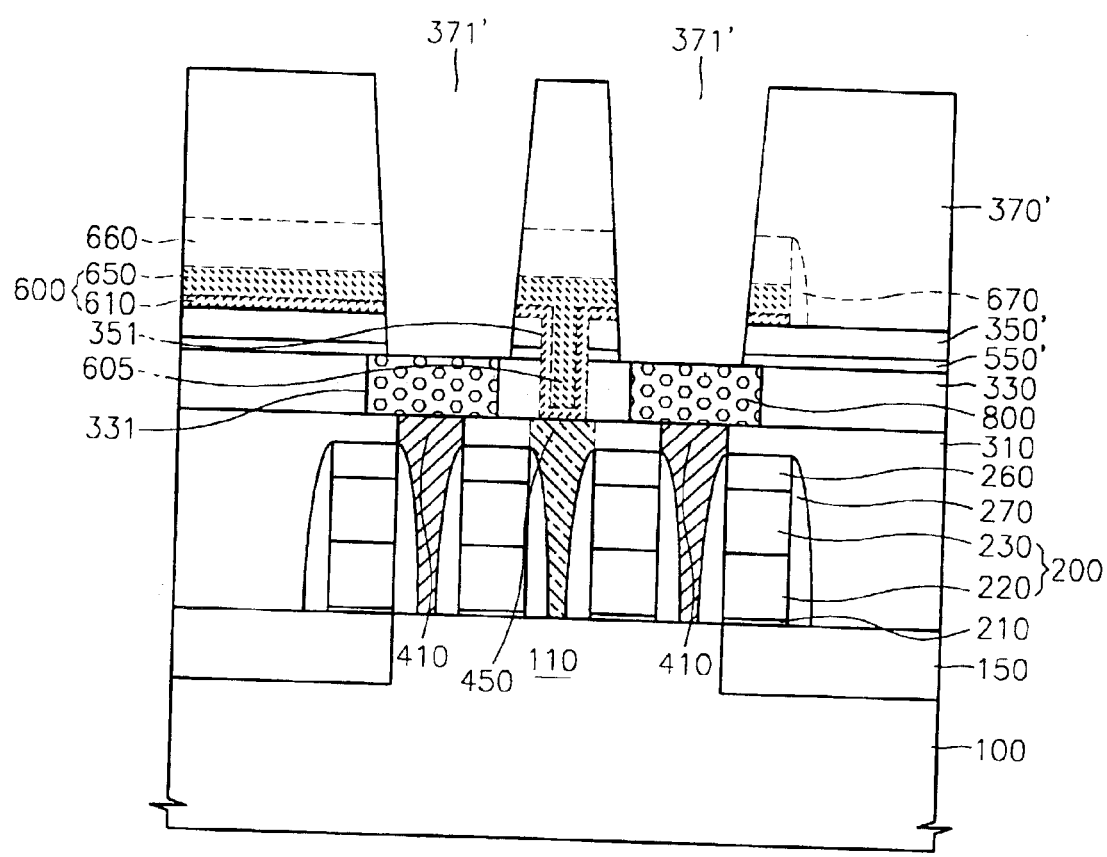

FIGS. 24 and 25 are a plan view and a cross-sectional view that illustrate a fourth insulating layer having contact holes for storage node contacts. A fourth insulating layer 370' covering the bit lines 600 may be formed. For example, the fourth insulating layer 370' may be formed by depositing a silicon oxide layer having a good gap-filling characteristic, such as HDP oxide, BPSG, Tosz, or the like. The surface of the fourth insulating layer 370' may be planarized by a planarization process which may be performed using CMP. The fourth insulating layer 370' may be selectively etched using a photolithography process and an etching process to form first contact holes 371' exposing the surfaces of the landing pads 800. The first contact holes 371' may be prepared for storage node contacts, i.e., first contacts.

The etch stopper 550 may stop the selective etching process for the first contact holes 371'. The first contact holes 371' may be overetched to expose the upper surfaces of the landing pads 800.

Here, although the centers of the first contact holes 371' slightly deviate from the centers of the landing pads 800, portions of the second insulating layer 330 around the landing pads 800 may remain to a sufficient thickness after the etching process so that the first contact holes 371' are electrically insulated from the second contact pad 450. Also, although the centers of the first contact holes 371' slightly deviate from the centers of the first contact pads 410, the landing pads 800 may be formed to have a critical dimension wider than the first contact pads 410 so that contact areas of the landing pads 800 exposed by the first contact holes 371' are sufficient in preventing an increase in contact resistance due to a misalignment.

For example, when the centers of the first contact holes 371' deviate from the centers of the first contact pads 410 or the centers of the landing pads 800 as shown in FIG. 25, etch stopper portions 550' of the etch stopper 550 around the landing pads 800 are exposed during the etching process for forming the first contact holes 371'. However, because the etch stopper portions 550' of the etch stopper 550 are made of a material resistant to the etching of the first contact holes 371', the etch stopper portions 550' of the etch stopper 550 resist etching. The etch stopper portions 550' are removed while portions of the second insulating layer 330 forming the sidewalls of the first contact holes 371' sufficiently remain. Portions of the second insulating layer 330 exposed by the first contact holes 371' are protected from erosion by such an etching process and remain to a sufficient thickness.

The remaining portions of the second insulating layer 330 insulate the second contact pad 450 from the first contact holes 371'. Thus, although the first contact holes 371' are misaligned with the first contact pads 410, the creation of a pattern bridge between the first contact holes 371' and a second contact 605 for the bit lines 600 or the second contact pad 450 can be prevented. Consequently, a process margin, an overlay margin, or a misalignment margin may be further obtained when forming the first contact holes 371'. Because widths of the first contact holes 371' may be larger, the first contact holes 371' may be formed to a critical dimension wider than the storage node contacts whose shapes are made by the first contact holes 371', i.e., the first contacts. Thus, contact resistance of the storage node contacts may be lowered.

Figure 26:
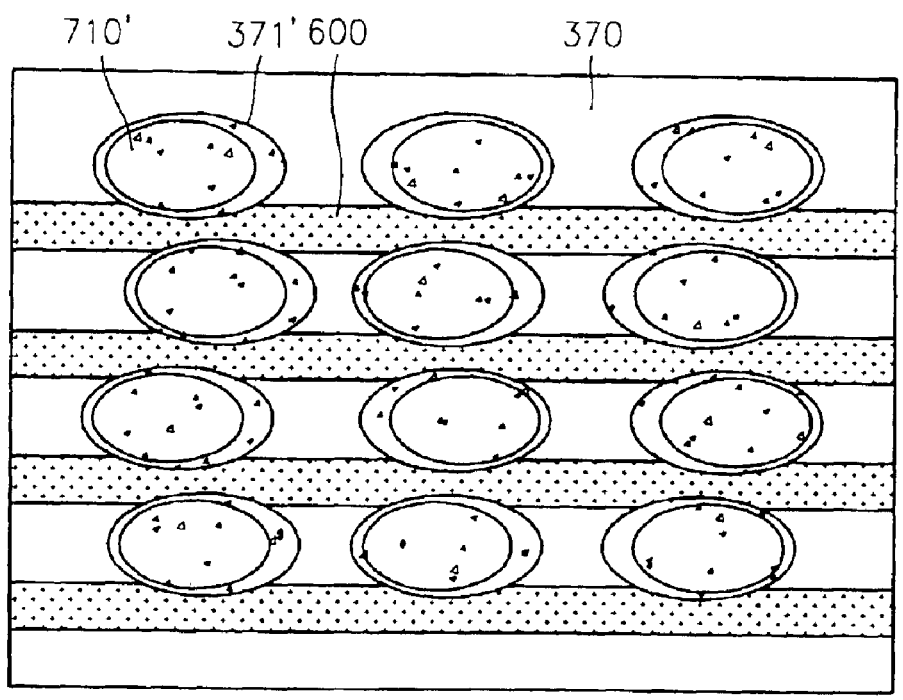
Figure 27:
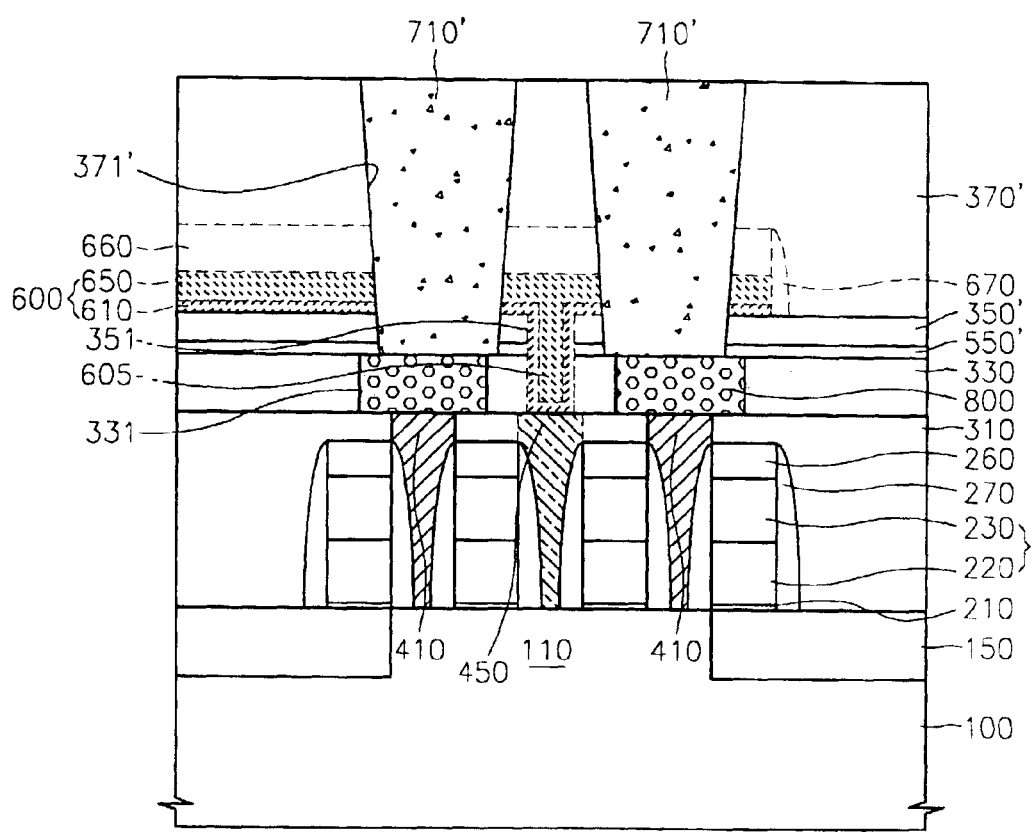

FIGS. 26 and 27 are a plan view and a cross-sectional view that illustrate storage node contacts. A conductive layer filling the first contact holes 371', e.g., a conductive polysilicon layer, may be formed. The conductive layer may be planarized using etch back or CMP to form first contacts 710' connected to the landing pads 800, i.e., storage node contacts. For example, first contacts 710' may be formed to a wider critical dimension due to the second insulating layer 330, the guide contact holes 331, the landing pads 800, the etch stopper 550, and so forth. In particular, the first contacts 710' may extend in a longitudinal direction in which the bit lines 600 extend.

A wider margin may be used when positioning the arrangement of storage nodes that will be connected to the first contact holes 710'. Because the critical dimensions of the first contact holes 710' are wider, the critical dimensions can be used for the arrangement of the storage nodes that will be connected to the first contact holes 710'. Thus, although the storage nodes are misaligned with the centers of the first contacts 710', the storage nodes may sufficiently contact the first contact holes 710' so as to prevent an increase in contact resistance, or to provide an acceptable increase.

Figure 28:
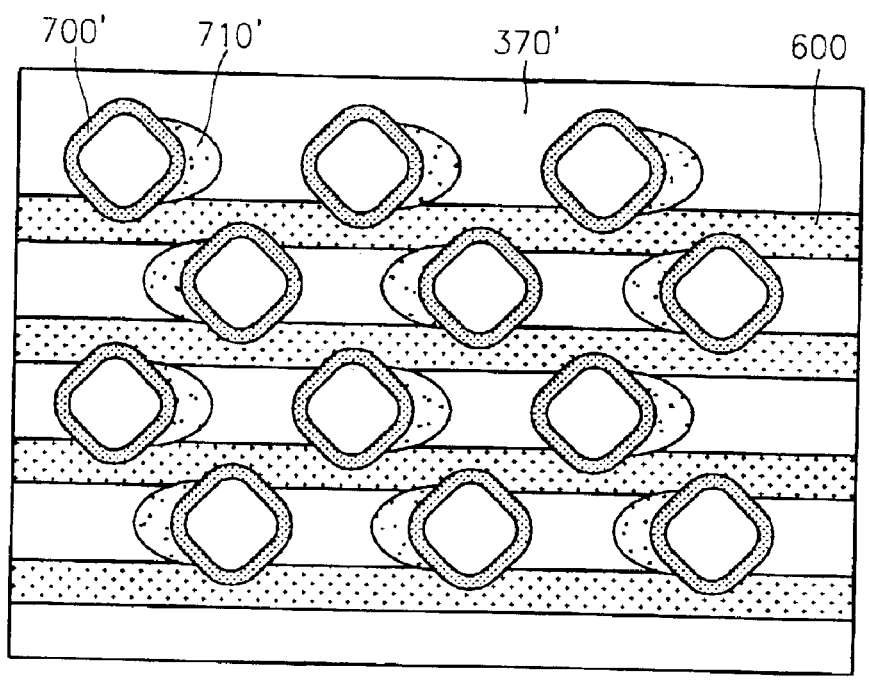
Figure 29:
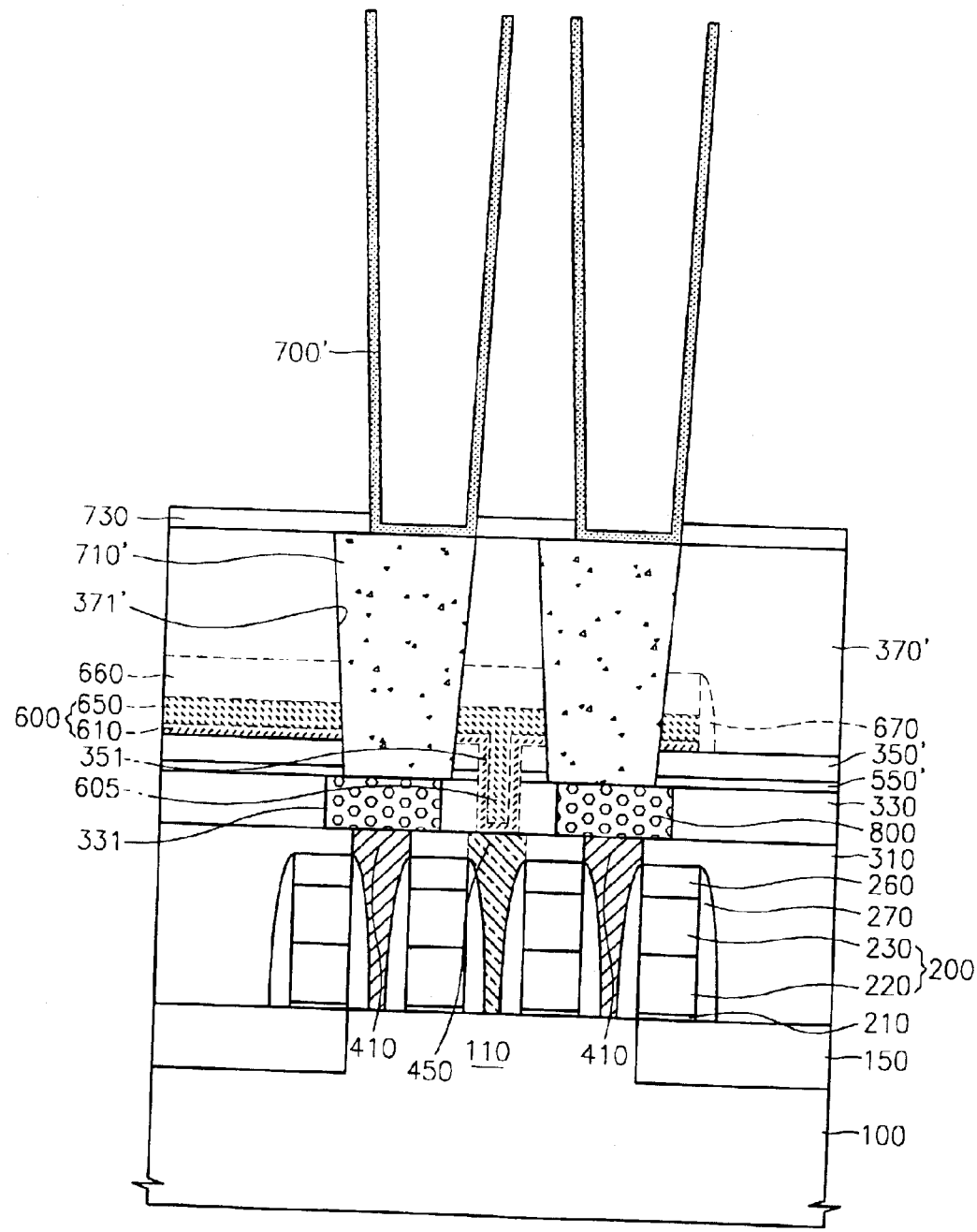

FIGS. 28 and 29 are a plan view and a cross-sectional view schematically illustrating storage nodes. Storage nodes may be formed on the fourth insulating layer 370' to be three-dimensional, i.e., cylindrical. A node support layer 730 may be formed around the lower portions of the storage nodes 700' to support the storage nodes 700' so as to prevent the storage nodes 700' from slanting.

As seen in the plan view of FIG. 28, the storage nodes 700' may be substantially square. The storage nodes 700' may be zigzagged in the longitudinal direction in which the bit lines 600 extend. Thus, gaps among the storage nodes 700' may be maximized. As a result, as the integration density of the semiconductor device increases and the minimum critical dimension of the semiconductor device decreases, the formation of bridges among the storage nodes 700' may be sufficiently prevented.

Although the centers of the storage nodes 700' do not coincide with the centers of the first contacts 710', a sharp increase in contact resistance of the storage node contacts may be efficiently prevented. The increase in contact resistance may be efficiently prevented or limited because the first contacts 710' may be formed larger. For example, the shape and arrangement of the storage nodes 700' shown in FIG. 28 may be provided. Furthermore, the first contacts 710' may extend further and the landing pads 800 can be formed wider than the first contact pads 410. Thus, the storage node contacts, i.e., overlapping areas among the first contacts 710', the first contact pads 410, the landing pads 800, and the storage nodes 700', may increase. As a result, contact resistance may decrease.

Third Embodiments

In some third embodiments of the present invention, landing pads are formed that at least partially fill guide contact holes at the same time as resistant bodies are formed in a peripheral area of the semiconductor device. Reference numerals of the third embodiments that are the same as those of the first and second embodiments denote identical elements.

Figure 30:
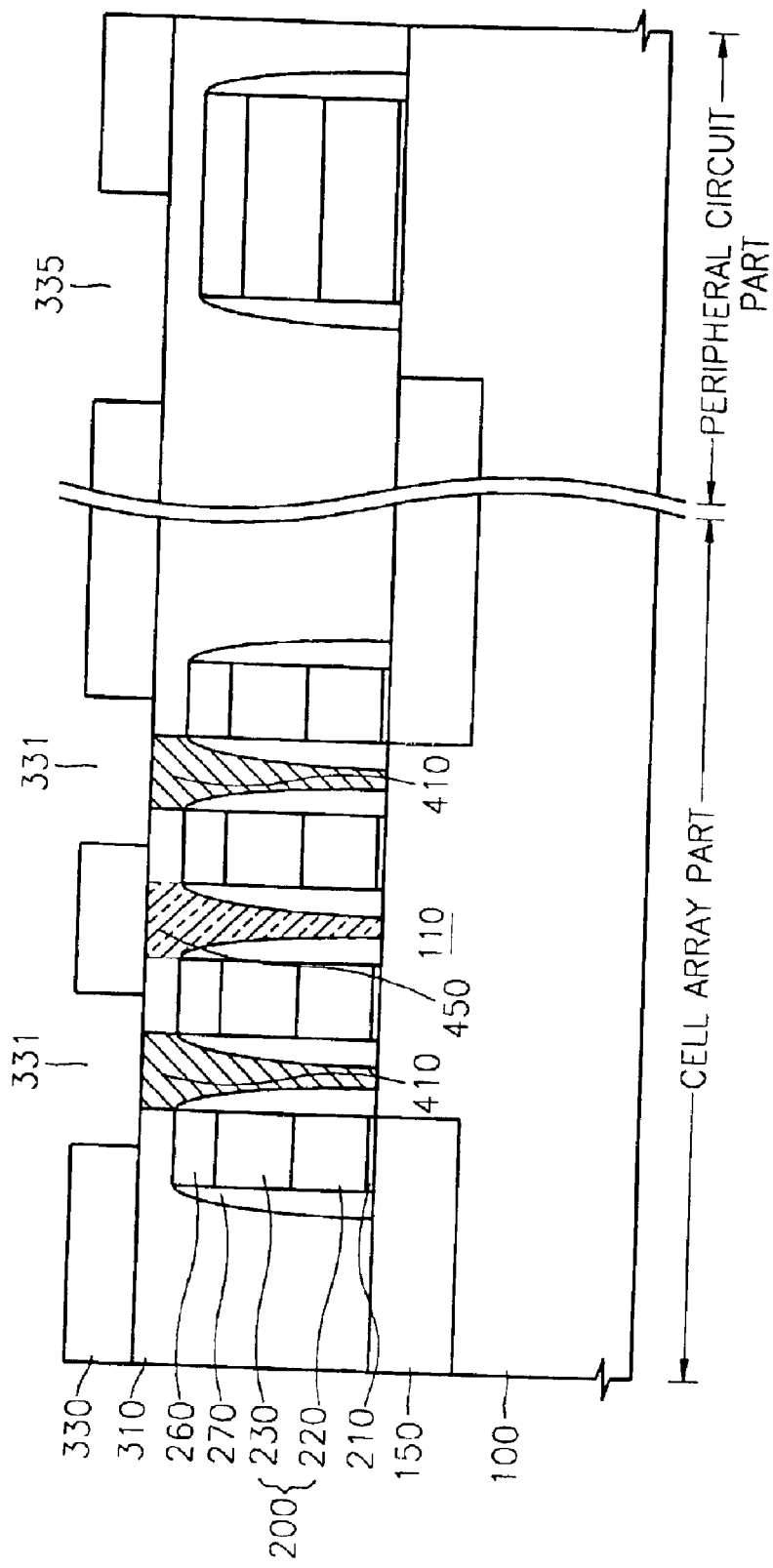

FIGS. 30 and 31 are cross-sectional views that illustrate a method of manufacturing a semiconductor device having storage nodes according to third embodiments of the present invention.

As described in the first and second embodiments, first contact pads 410 and a second contact pad 450, which penetrate through a first insulating layer 310 and are connected to a semiconductor substrate 100, may be formed in a cell array part.

FIG. 30 is a cross-sectional view that illustrates a second insulating layer having an opening groove for patterning guide contact holes that expose contact pads and resistance patterns. Referring to FIG. 30, a second insulating layer 330 covering the first and second contact pads 410 and 450 may be formed on the first insulating layer 310. The second insulating layer 330 may serve to prevent the creation of pattern bridges or electrical bridges among contacts that will be subsequently formed and the first and second contact pads 410 and 450, particularly first contacts connected to the first contacts 410 and the second contact pad 450. For example, the second insulating layer 330 may be formed by depositing silicon oxide on the first insulating layer 310 to a thickness of about 1000 Å.

The second insulating layer 330 may be selectively etched, i.e., guide contact holes 331 may be formed to expose the first contact pads 410 that are buried contact pads, using a photolithography process and a dry etching process. An opening groove 335 for a resistant pattern may be formed in a peripheral circuit part at the same time when the guide contact holes 331 are formed. The opening groove 335 and the guide contact holes 331 may be simultaneously formed using a photolithography process and an etching process.

FIG. 31 is a cross-sectional view that illustrates landing pads that fill the guide contact holes 331 and a resistant pattern filling the opening groove 335. Referring to FIG. 31, landing patterns 800 may be formed on the second insulating layer 330 to fill the guide contact holes 331. For example, polysilicon doped with conductive N-type impurities may be deposited to a thickness of about 1500 Å and divided using dry etch back or CMP to form landing pads 800. At the same time, the polysilicon may be deposited on the opening groove 335 and patterned using etch back or CMP to form a resistant pattern 850. Thus, the resistant pattern 850 may be formed to the same height and thickness as the landing pads 800.

Processes for forming the landing pads 800 may be performed in the peripheral circuit part to simultaneously form the resistant pattern 850. In this manner, the process steps for forming the landing pads 800 and the semiconductor device may be reduced.

First contacts 710' and storage nodes 700' may be formed on the landing pads 800 using the processes described with reference to FIGS. 21 through 28 in the second embodiments.

As described above, when misalignment occurs during manufacturing of the semiconductor device, and in particular, misalignment that may occur between the first contacts and the first contact pads, the guide contact holes and the etch stopper may prevent an electrical bridge between the first contacts and the second contact pads. Accordingly, greater misalignment during manufacturing may be tolerated, and which may thereby allow further reduction in the size of the semiconductor device. The storage nodes may be zigzagged in a longitudinal direction of the bit lines to further increase the margins and avoid electrical bridging. The storage nodes may be substantially square to provide larger gaps among the storage nodes. As a result, the integration density of the semiconductor device may increase and the minimum critical dimension of the semiconductor device may decrease.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
   forming a first insulating layer on a semiconductor substrate;
   forming first contact pads and second contact pads which penetrate through the first insulating layer and are electrically connected to the semiconductor substrate;
   forming a second insulating layer having guide contact holes exposing upper surfaces of the first contact pads, wherein the guide contact holes of the second insulating layer each define a bottom and sidewall;
   forming an etch stopper on the bottoms and the sidewalls of the guide contact holes of the second insulating layer; and
   forming bit lines electrically connected to the semiconductor substrate by the second contact pads, and wherein the bit lines are electrically isolated from the first contact pads, and the bit lines are formed after forming the etch stopper.

2. A method of manufacturing a semiconductor device, the method comprising:
   forming a first insulating layer on a semiconductor substrate;
   forming first contact pads and second contact pads which penetrate through the first insulating layer and are electrically connected to the semiconductor substrate;
   forming a second insulating layer having guide contact holes exposing upper surfaces of the first contact pads, wherein the guide contact holes of the second insulating layer each define a bottom and sidewall;
   forming an etch stopper on the bottoms and the sidewalls of the guide contact holes of the second insulating layer; and
   forming bit lines electrically connected to the semiconductor substrate by the second contact pads, and wherein the bit lines are electrically isolated from the first contact pads, wherein the guide contact holes are wider than the first contact pads.

3. The method of claim 2, wherein the etch stopper comprises silicon nitride.

4. A method of manufacturing a semiconductor device, the method comprising:
   forming a first insulating layer on a semiconductor substrate;
   forming first contact pads and second contact pads which penetrate through the first insulating layer and are electrically connected to the semiconductor substrate;
   forming a second insulating layer having guide contact holes exposing upper surfaces of the first contact pads, wherein the guide contact holes of the second insulating layer each define a bottom and sidewall;
   forming an etch stopper on the bottoms and the sidewalls of the guide contact holes of the second insulating layer;
   forming bit lines electrically connected to the semiconductor substrate by the second contact pads, and wherein the bit lines are electrically isolated from the first contact pads;
   forming a third insulating layer on the etch stopper and filling the guide contact holes, wherein the bit lines are formed on the third insulating layer opposite to the second insulating layer; and
   forming second contacts that penetrate through the third insulating layer and are electrically connected to the second contact pads, wherein the second contacts electrically connect the bits lines to the second contact pads.

5. The method of claim 4, wherein the etch stopper comprises a material having a low etching rate relative to the third insulating layer.

6. The method of claim 4, further comprising:
   forming a fourth insulating layer that covers the bit lines;
   etching the third and fourth insulating layers to provide first contact holes that expose at least upper surfaces of the first contact pads, wherein the etch stopper protects portions of the second insulating layer around the guide contact holes from erosion; and
   forming first contacts in the first contact holes and electrically connected to the first contact pads, wherein the first contacts are electrically insulated from the second contact pads by the portions of the second insulating layer around the guide contact holes.

7. The method of claim 6, wherein the first contacts are widest in a direction along the bit lines.

8. The method of claim 6, wherein the first contact holes are wider than the first contact pads.

9. The method of claim 6, wherein the first contact holes are widest in a direction along the bit lines.

10. The method of claim 6, wherein portions of the first contact holes expose portions of the second insulating layer adjacent to the sidewalls of the guide contact holes.

11. The method of claim 6, further comprising forming storage nodes on the fourth insulating layer and electrically connected to the first contacts.

12. The method of claim 11, wherein the storage nodes are formed with zigzagged positions along axes extending along the bit lines.

13. A method of manufacturing a semiconductor device, the method comprising:
   forming a first insulating layer on a semiconductor substrate;
   forming first contact pads and second contact pads which penetrate through the first insulating layer and are electrically connected to the semiconductor substrate;
   forming a second insulating layer having guide contact holes exposing upper surfaces of the first contact pads, wherein the guide contact holes of the second insulating layer each define a bottom and sidewall;
   forming landing pads in the guide contact holes and electrically connected to the first contact pads;
   forming an etch stopper on the landing pads and the second insulating layer; and forming bit lines electrically connected to the semiconductor substrate by the second contact pads, and wherein the bit lines are electrically isolated from the first contact pads.

14. The method of claim 13, wherein the guide contact holes are wider than the first contact pads.

15. The method of claim 13, wherein the etch stopper comprises silicon nitride.

16. The method of claim 13, wherein forming landing pads comprises:

forming a conductive layer filling the guide contact holes; and planarizing the conductive layer.

17. The method of claim 13, wherein the landing pads comprise conductive polysilicon.

18. The method of claim 13, further comprising:

forming a third insulating layer on the etch stopper, wherein the bit lines are formed on the third insulating layer opposite to the second insulating layer; and forming second contacts that penetrate through the third insulating layer and are electrically connected to the second contact pads, wherein the second contacts electrically connect the bits lines to the second contact pads.

19. The method of claim 18, wherein the etch stopper comprises a material having a low etching rate relative to the third insulating layer.

20. The method of claim 18, further comprising:

forming a fourth insulating layer covering the bit lines;

etching the third and fourth insulating layers to form first contact holes that expose at least upper surfaces of the landing pads, wherein the etch stopper protects portions of the second insulating layer around the guide contact holes from erosion; and forming first contacts in the first contact holes and electrically connected to the landing pads, wherein the first contacts are electrically insulated from the second contact pads by the portions of the second insulating layer around the guide contact holes.

21. The method of claim 20, wherein the first contacts are widest in a direction along the bit lines.

22. The method of claim 20, wherein the first contact holes expose portions of the portions of the second insulating layer around the guide contact holes.

23. The method of claim 20, further comprising forming storage nodes on the fourth insulating layer that are electrically connected to the first contacts.

24. The method of claim 23, wherein the storage nodes are formed with zigzagged positions along axes extending along the bit lines.

25. A method of manufacturing a semiconductor device, the method comprising:

providing a semiconductor substrate having a cell array part and a peripheral circuit part;

forming a first insulating layer on the semiconductor substrate;

forming second contact pads that penetrate through the first insulating layer and are electrically connected to the semiconductor substrate of the cell array part;

forming a second insulating layer on the first insulating layer, the second insulating layer defining guide contact holes that expose upper surfaces of the first contact pads and defining an opening groove that exposes a portion of the first insulating layer in the peripheral circuit part;

forming landing parts that fill the guide contact holes and a resistant pattern that fills the opening groove;

forming an etch stopper on the second insulating layer;

forming a third insulating layer on the etch stopper;

forming second contacts that penetrate through the third insulating layer and are electrically connected to the second contact pads;

forming bit lines on the third insulating layer and that are electrically connected to the semiconductor substrate by the second contacts and the second contact pads;

forming a fourth insulating layer that covers the bit lines;

etching the third and fourth insulating layers to form first contact holes that expose at least upper surfaces of the landing pads, wherein the etch stopper protects portions of the second insulating layer around the guide contact holes from erosion; and forming first contacts in the first contact holes and electrically connected to the landing pads, wherein the first contacts are electrically insulated from the second contact pads by the portions of the second insulating layer around the guide contact holes; and forming storage nodes on the fourth insulating layer that are electrically connected to the first contacts.

26. The method of claim 25, wherein forming landing pads that fill the guide contact holes and a resistant pattern that fills the opening groove comprises:

forming a conductive layer that simultaneously fills the guide contact holes and the opening groove; and planarizing the conductive layer.

27. The method of claim 25, wherein the landing pads and the resistant pattern comprise conductive polysilicon.

* * * * *